United States Patent
Yokoi et al.

(10) Patent No.: US 11,901,211 B2
(45) Date of Patent: Feb. 13, 2024

(54) SEMICONDUCTOR-PROCESSING TAPE

(71) Applicant: FURUKAWA ELECTRIC CO., LTD., Tokyo (JP)

(72) Inventors: Hirotoki Yokoi, Tokyo (JP); Yukihiro Matsubara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 289 days.

(21) Appl. No.: 16/432,653

(22) Filed: Jun. 5, 2019

(65) Prior Publication Data

US 2019/0311937 A1  Oct. 10, 2019

Related U.S. Application Data

(63) Continuation of application No. PCT/JP2017/043649, filed on Dec. 5, 2017.

(30) Foreign Application Priority Data

Dec. 7, 2016  (JP) .................... 2016-238020

(51) Int. Cl.
*H01L 21/304* (2006.01)
*H01L 21/683* (2006.01)
(Continued)

(52) U.S. Cl.
CPC .......... *H01L 21/6836* (2013.01); *B23K 26/53* (2015.10); *B32B 7/10* (2013.01);
(Continued)

(58) Field of Classification Search
None
See application file for complete search history.

(56) References Cited

U.S. PATENT DOCUMENTS

2004/0180473 A1    9/2004  Kawai
2007/0141330 A1*   6/2007  Morishima .............. C09J 7/20
                                                       428/343
(Continued)

FOREIGN PATENT DOCUMENTS

CN    102473617 A    5/2012
CN    103013365 A    4/2013
(Continued)

OTHER PUBLICATIONS

Nomura, Yoshihiro et al., "Adhesive Tape for Dicing Semiconductor Wafer", machine translation of JP 2007088240 A, Apr. 5, 2007 (Year: 2007).*

(Continued)

*Primary Examiner* — Anish P Desai

(74) *Attorney, Agent, or Firm* — Birch, Stewart, Kolasch & Birch, LLP

(57) ABSTRACT

A semiconductor-processing tape, for use in dividing an adhesive layer along semiconductor chips by expansion, having a base material film, a removable adhesive layer, and an adhesive layer, in this order, wherein the base material film has the stress values in MD and TD at the time of 5%-elongation of 5 MPa or, more, the tensile strength values in MD and TD at the time of 5%-elongation of 10 to 30 N/25 mm, and the thickness of from 70 to 150 μm, and wherein the adhesive layer has a thickness of 40 μm or more and the storage elastic modulus at 25° C. of 2000 MPa or less.

4 Claims, 4 Drawing Sheets

(51) Int. Cl.

| | | |
|---|---|---|
| *B23K 26/53* | (2014.01) | |
| *C09J 7/24* | (2018.01) | |
| *C09J 7/29* | (2018.01) | |
| *C09J 7/38* | (2018.01) | |
| *H01L 21/78* | (2006.01) | |
| *B32B 7/10* | (2006.01) | |
| *C09J 201/00* | (2006.01) | |
| *C09J 7/20* | (2018.01) | |
| *B32B 27/00* | (2006.01) | |

(52) U.S. Cl.
CPC ............... *B32B 27/00* (2013.01); *C09J 7/20* (2018.01); *C09J 7/245* (2018.01); *C09J 7/29* (2018.01); *C09J 7/38* (2018.01); *C09J 7/385* (2018.01); *C09J 201/00* (2013.01); *H01L 21/304* (2013.01); *H01L 21/78* (2013.01); *C09J 2203/326* (2013.01); *C09J 2301/414* (2020.08); *C09J 2423/046* (2013.01); *C09J 2433/00* (2013.01); *C09J 2433/006* (2013.01); *C09J 2461/00* (2013.01); *C09J 2463/00* (2013.01); *Y10T 428/2848* (2015.01)

(56) References Cited

U.S. PATENT DOCUMENTS

| | | | |
|---|---|---|---|
| 2013/0330910 A1 | 12/2013 | Tanaka et al. | |
| 2014/0322528 A1* | 10/2014 | Taya | ............... C09J 7/381 428/343 |

FOREIGN PATENT DOCUMENTS

| | | |
|---|---|---|
| CN | 103140917 A | 6/2013 |
| JP | 2001-203255 A | 7/2001 |
| JP | 2003-338467 A | 11/2003 |
| JP | 2004-273895 A | 9/2004 |
| JP | 2007-5530 A | 1/2007 |
| JP | 2007088240 A * | 4/2007 |
| JP | 2009-242586 A | 10/2009 |
| JP | 2011-216508 A | 10/2011 |
| KR | 10-2011-0110001 A | 10/2011 |
| KR | 10-2012-0023811 A | 3/2012 |
| KR | 10-2014-0116058 A | 10/2014 |
| WO | WO 2011/004825 A1 | 1/2011 |
| WO | WO 2012/043340 A1 | 4/2012 |
| WO | WO 2014/080918 A1 | 5/2014 |

OTHER PUBLICATIONS

Yoshihiro Nomura, "Adhesive Tape for Semiconductor Wafer Dicing", English translation of JP 200788240, Apr. 5, 2007 (Year: 2007).*

Kazushige, Iwamoto et al., "Adhesive Tape for Fixing Semiconductor Wafers", English translation of JP 98111A, Jan. 10, 1997 (Year: 1997).*

Taiwanese Office Action, dated Jun. 18, 2021, for corresponding Taiwan Application No. 106142959, with an English translation.

International Search Report (PCT/ISA/210) issued in PCT/JP2017/043649, dated Feb. 27, 2018.

Korean Office Action, dated Oct. 17, 2020, for corresponding Korean Application No. 10-2019-7018459, with an English translation.

Written Opinion of the International Searching Authority (PCT/ISA/237) issued in PCT/JP2017/043649, dated Feb. 27, 2018, with English translation.

Chinese Office Action and Search Report for corresponding Chinese Application No. 201780074787.8, dated Sep. 7, 2022, with an English translation.

* cited by examiner

SEMICONDUCTOR-PROCESSING TAPE

CROSS-REFERENCE TO RELATED APPLICATIONS

This application is a Continuation of PCT International Application No. PCT/JP2017/043649 filed on Dec. 5, 2017, which claims priority under 35 U.S.C. § 119 (a) to Japanese Patent Application No. 2016-238020 filed in Japan on Dec. 7, 2016. Each of the above applications is hereby expressly incorporated by reference, in its entirety, into the present application.

TECHNICAL FIELD

The present invention relates to a semiconductor-processing tape which is excellent in a pick-up property.

BACKGROUND ART

Conventionally, production of the semiconductor element (semiconductor chip) such as an integrated circuit (IC) has been usually performed through the following processes. Specifically, the processes include: a back grind process that grinds a wafer back surface in order to thin the wafer after formed with a circuit-pattern; a dicing process that sticks a semiconductor-processing tape which has adhesion and stretch properties, on the wafer back surface, and then divides the wafer into semiconductor chip units; an expansion process that extends (expands) the semiconductor-processing tape; a pick-up process that picks up the divided semiconductor chips; and further a die bonding (mount) process that adheres the picked semiconductor chips to a lead frame, a package substrate, or the like (or stacks up semiconductor chips and adheres to each other in the stacked package).

In the above-described processes ranging from the dicing process after the back grind process to the mount process, a semiconductor-processing tape in which a removable adhesive layer and an adhesive layer are stacked up in this order on a base material film, is used. In general, in a case of using such semiconductor-processing tape, at the beginning, an adhesive layer of the semiconductor-processing tape is laminated on the wafer back surface to fix the wafer and then the wafer together with the adhesive layer are subjected to a dicing into semiconductor chip units by using a dicing blade. After that, an expansion process that expands the tape in a radial direction of the wafer, thereby increasing the space between semiconductor chips, is performed. This expansion process is intended to increase a recognition performance of the semiconductor chip by means of CCD camera in the subsequent pick-up process. Further, this process is also intended to prevent the semiconductor chips from damage that is caused by contact of neighboring semiconductor chips when the semiconductor chips are picked up. After that, the semiconductor chips together with the adhesive layer in the pick-up process are separated from the removable adhesive layer thereby to be picked up, and then are directly adhered to a lead frame, a package substrate, or the like in the mount process.

In this way, the use of the semiconductor-processing tape enables the semiconductor chips with an adhesive layer to adhere directly to a leadframe, a package substrate, or the like. Accordingly, this allows elimination of a coating process of adhesives or a process for adhesion of a die bonding film to each of the semiconductor chips separately.

A method of subjecting only a wafer to a dicing by a blade in the dicing process and dividing an adhesive layer for each semiconductor chip by expanding a semiconductor-processing tape, is proposed (for example, Patent literature 1)

Further, in recent years, as a cutting method of the wafer, a method of cutting a wafer by a non-contact system including irradiation of a laser light and expansion of a tape, is proposed (for example, Patent literature 2 and Patent literature 3). The cutting method of the wafer described in the foregoing Patent literature 2 and Patent literature 3 allows the wafer cutting with a minimum physical load to the wafer without generating wafer shavings (chipping) as when performing a currently mainstream blade dicing. Further, because an adhesive layer is divided by expansion, this method also does not generate shavings of the adhesive layer. Therefore, this method is brought to attention as advanced technologies by which the blade dicing can be replaced.

Further, in order to prevent the situation that looseness after the expand process makes it impossible for the tape to stably maintain an individual space between semiconductor chips, Patent literature 4 proposes a method of maintaining a space between semiconductor chips by heat-shrinking and tensing up the tape after the dividing process.

On the other hand, in the past, the thickness of the wafer has been required to be controlled to the extent of 200 to 400 μm by a back grind or the like. However, with a progress of a recent high-density mounting technology, miniaturization of the semiconductor chips is needed. Concomitantly, the film thinning of the wafer has been also advanced. Dependent on the type of the semiconductor chip, it is required to thin the wafer to the extent of 100 μm. On the other hand, in order to increase the number of the semiconductor chip which can be produced by a single work thereof, the radius of the original wafer has a tendency to be made larger. Until now, a wafer having a diameter of 5 inches or 6 inches was of mainstream. In contrast, in recent years, a processing that processes a wafer having a diameter of 8 to 12 inches to semiconductor chips is becoming a mainstream.

A tendency of making the radius of the wafer larger and thinning the wafer at the same time is tremendous particularly in the field of a flash memory in which a NAND type and a NOR type exist, and in the field of DRAM (Dynamic Random Access Memory) of a volatile memory, and the like. For example, it is also not uncommon for the wafer having a diameter of 12 inches to be ground until the thickness of 150 μm or less.

In addition to this, in recent years in particular, along with the popularization of the smart phone, upgrade of the cell-phone, and both miniaturization and upgrade of the music player, a need for the film thinning is also growing for a wafer that is used in a flip-chip mounting in which a wafer with an electrode is used on the basis of shockproof consideration or the like. Further, a wafer with a bump is also required to subject a wafer portion to a thin film grinding processing of 100 μm or less. Densification of the bump to be subjected to a flip-chip interconnection has been performed for the purpose of improvement in transfer speed, so that the height of the bump (protrusion height from the surface of a wafer) is becoming lower. Concomitantly, a bump-to-bump spacing is becoming shorter. Further, in recent years, because the flip-chip interconnection has been also practiced in DRAM, the film thinning of the wafer has been also accelerated.

The flip-chip mounting has attracted attention as a method by which semiconductor elements can be mounted in a minimum area, corresponding to miniaturization and densification of the recent electronic instrument. A bump has been formed on an electrode of the semiconductor element used for the flip-chip mounting, and the bump and a wiring on a circuit board are electrically connected. As to the composition of these bumps, a solder or gold is mainly used. This solder bump or gold bump is formed by vapor deposition or plating on an exposed aluminum terminal or the like which connects to an internal wiring of the semiconductor chip.

However, it is hard to subject the wafer with a bump to a film-thinning processing because the wafer with a bump has a large concavity and convexity on the surface thereof. Concomitantly, if a back grind is performed using an ordinary removable adhesive tape, sometimes wafer cracks are generated or a wafer thickness precision is deteriorated. Accordingly, when the wafer with a bump is ground, a processing is performed using a specially designed surface protective tape (see, for example, Patent literature 5).

Further in recent years, a multi-chip package which produces semiconductor chips for various uses as one package is increasing through advances in the three-dimensional mounting technologies of the semiconductor chip. As one of the three-dimensional mounting technologies, studies on TSV (Through Silicon Via) or the like which uses a through electrode have been conducted. At the present time, however, TSV has not yet led to expansion into many products because of extremely high production cost. Instead of TSV, a development race of the products using a 2.5-dimensional layering technique speeds up, and a packaging system of further layering semiconductor chips on the top of wire-bonded semiconductor chips, or a mounting system of connecting a part of the wire-bonded semiconductor chips with a bump is being adopted.

In particular, in order to stack up additionally semiconductor chips on the top of wire-bonded semiconductor chips, a wire bonding has to be done through an adhesive layer after semiconductor chips were once mounted. So, an adhesive layer which has a lower storage elastic modulus and is thicker than a common adhesive layer is becoming used, whereby division of the adhesive layer is getting very difficult. The use of a blade dicing method allows division of the adhesive layer with ease to an extent. However, there are problems of semiconductor chip crack, pick-up failure and breakage of the semiconductor chip caused by a roll-up of the adhesive layer. Therefore, a processing through the use of a stealth technology which can be used mainly in the technical field of thin film wafer is needed.

CITATION LIST

Patent Literatures

Patent Literature 1: JP-A-2007-5530 ("JP-A" means unexamined published Japanese patent application)
Patent Literature 2: JP-A-2003-338467
Patent Literature 3: JP-A-2004-273895
Patent Literature 4: JP-A-2011-216508
Patent Literature 5: JP-A-2001-203255

SUMMARY OF INVENTION

Technical Problem

In order to embed a wire in the adhesive layer, or to make the adhesive layer follow a bump wafer to a satisfactory extent, both thickening of the adhesive layer and lowering of elasticity of the adhesive layer are considered. However, if the forgoing adhesive layer is adopted, there exist the following problems. In dividing of an adhesive layer by expansion, a force caused by the expansion is not adequately transferred to the adhesive layer, so that the adhesive layer cannot be divided, or even if divided, a space between semiconductor chips gets inadequate and therefore adhesive layers stick again to each other, so that semiconductor chips cannot be picked up.

In order to prevent the adhesive layer from re-adhesion, a method of excessively expanding a semiconductor-processing tape in the division process and subjecting the semiconductor-processing tape to heat shrinkage after the division process, is sometimes adopted. However, there is a problem that a space between semiconductor chips is not uniformly controlled, because a degree of shrinkage differs in the MD direction and the TD direction.

Further, there is a problem that it is difficult to separate the adhesive layer from a removable adhesive layer in the pick-up process.

The present invention is contemplated to provide a semiconductor-processing tape which allows division of an adhesive layer by expansion, homogenization of the space between semiconductor chips after heat shrinkage, and lowering of pick-up failure. In particular, the present invention is contemplated to provide a semiconductor-processing tape which enables the adhesive layer to divide by expansion, even if the tape is provided with a thick adhesive layer having a low storage elastic modulus for the purpose of embedding a wire or ensuring a following property for the bump.

Solution to Problem

In view of the above-described problems, the present inventors conducted intensive studies. As a result, the present inventors found that a semiconductor-processing tape in which a stress value and a tensile strength of the base material film and a thickness of the base material film have been controlled to a particular value, enables an adhesive layer to be divided in the expanding process. It was found that this semiconductor-processing tape enables an adhesive layer to be divided, even if the tape is provided with an adhesive layer having a low storage elastic modulus and a thick thickness (for example, having a thickness of 40 μm or more). Further, it was found that the use of this semiconductor-processing tape allows homogenization of the space between semiconductor chips after heat shrinkage, and lowering of pick-up failure. The present invention has been completed by these findings.

Specifically, the above-described problems have been achieved by the following means.

(1) A semiconductor-processing tape, for use in dividing an adhesive layer along semiconductor chips by expansion,
having a base material film, a removable adhesive layer, and an adhesive layer, in this order,
wherein the base material film has the characteristics that the stress values in MD and TD at the time of 5%-elongation are each 5 MPa or more, the tensile strength values in MD and TD at the time of 5%-elongation are each from 10 to 30 N/25 mm, and the thickness is from 70 to 150 μm, and
wherein the adhesive layer has the characteristics that the thickness is 40 μm or more and the storage elastic modulus at 25° C. is 2000 MPa or less.

(2) The semiconductor-processing tape described in the above item (1), for use in a method of producing semiconductor chips including the following processes (a) to (h):

(a) a process of laminating a surface protective tape on the surface of a wafer formed with a circuit, (b) a back grind process of grinding a back surface of the wafer, (c) a process of laminating the adhesive layer of the semiconductor-processing tape on the back surface of the wafer at the heated state of the wafer, (d) a process of separating the surface protective tape from the wafer surface, (e) a process of irradiating a laser light to a planned dividing line of the wafer, to form a modified region due to multiphoton absorption in the interior of the wafer, (f) an expansion process of expanding the semiconductor-processing tape, thereby dividing the wafer and the adhesive layer along the planned dividing line, to obtain a plurality of semiconductor chips on each of which the adhesive layer has been laminated, (g) a process of maintaining a space between the semiconductor chips in the semiconductor-processing tape after the expansion process, by subjecting a portion of said semiconductor-processing tape which does not overlap with the semiconductor chips, to heat shrinkage, and thereby to eliminate laxation caused by the expansion process, and (h) a process of picking up the semiconductor chips on each of which the adhesive layer has been laminated, from the removable adhesive layer of the semiconductor-processing tape, while maintaining the space between the semiconductor chips.

(3) The semiconductor-processing tape described in the above item (1) or (2), wherein the base material film comprises a thermoplastic crosslinked resin, and the thermoplastic crosslinked resin has a melting point of from 80 to 95° C. and the melt flow rate of from 0.5 to 5.0 g/10 min.

(4) The semiconductor-processing tape described in the above item (3), wherein the thermoplastic crosslinked resin is a zinc ionomer resin and the flexural modulus of the base material film is 200 MPa or less.

In the present invention, the expression "dividing an adhesive layer along semiconductor chips" means to divide the adhesive layer so that the bottom surface shape of the adhesive layer after division would be the same as the bottom surface shape of the semiconductor chip. Meanwhile, also in a case of "dividing the wafer and the adhesive layer along the planned dividing line", the bottom surface shape of the semiconductor chip divided along the planned dividing line and the bottom surface shape of the adhesive layer divided along the planned dividing line becomes the same.

Effects of Invention

The semiconductor-processing tape provided by the present invention allows division of the adhesive layer, because a stress due to expansion is transmitted to the adhesive layer. Further, even an adhesive layer having a low storage elastic modulus and having a thick thickness can be divided. Further, because the deformation amount of the base material film by the expansion is adequate, a space between semiconductor chips can be uniformed and a pick-up failure can be lowered.

The above-described and other features and advantages of the invention will become appear more fully from the following description, appropriately referring to the accompanying drawings.

BRIEF DESCRIPTION OF THE DRAWINGS

FIG. 6 ($b$) is a cross-sectional view showing a process of dividing the wafer into semiconductor chips by expansion of the semiconductor-processing tape. FIG. 6($c$) is an end view for showing a semiconductor-processing tape, an adhesive layer and semiconductor chips, after expansion.

MODE FOR CARRYING OUT THE INVENTION

[Semiconductor-Processing Tape]

The semiconductor-processing tape of the present invention has a base material film, a removable adhesive layer and an adhesive layer. The semiconductor-processing tape of the present invention is an expandable semiconductor-processing tape, which is used when dividing an adhesive layer along semiconductor chips by expansion. The semiconductor-processing tape of the present invention is used as the so-called dicing die bonding tape.

In the semiconductor-processing tape of the present invention, the base material film has the characteristics that the stress values in MD and TD at the time of 5%-elongation are each 5 MPa or more, the tensile strength in MD and TD at the time of 5%-elongation are each from 10 to 30 N/25 mm, and the thickness is from 70 to 150 µm, and the adhesive layer has the characteristics that the thickness is 40 µm or more and the storage elastic modulus at 25° C. is 2000 MPa or less.

If the above-described conditions are met, the semiconductor-processing tape of the present invention allows division of the adhesive layer along semiconductor chips by expanding it in an ordinary elongation amount (elongation 5 to 10%) in the expanding process. The expansion is preferably performed by uniformly expanding a semiconductor-processing tape toward the outer peripheral direction of the wafer on which the semiconductor-processing tape has been laminated.

Figure 1:
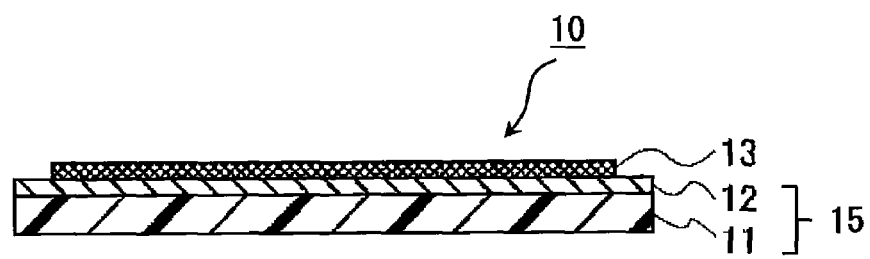
FIG. 1 is a cross-sectional view schematically showing a structure of the semiconductor-processing tape according to an embodiment of the present invention.

FIG. 1 is a cross-sectional view showing a semiconductor-processing tape 10 according to one embodiment of the present invention. This semiconductor-processing tape 10 has a removable adhesive tape 15 composed of a base material film 11 and a removable adhesive layer 12, and an adhesive layer 13 provided on the removable adhesive layer 12, and the back surface of the wafer is set to be laminated on the adhesive layer 13. Meanwhile, each layer may be preliminarily cut (precut) in a prescribed shape in accordance with a use process or apparatus. Further, the semiconductor-processing tape 10 of the present invention may be in a form in which the tape has been cut for each piece of a wafer. Alternatively, the tape may be in a form in which a long sheet formed by a plurality of tapes cur for each piece of a wafer has been rolled up.

In the present invention, the removable adhesive layer means a coating layer of the removable adhesive composition, and is in a state in which a polymer contained in the removable adhesive composition is exerting an adhesive power or a coagulation power. In a case where a compound (B) described below it contained in the removable adhesive composition, components in the removable adhesive composition are crosslinked to be in a state in which an adhesive power and a coagulation power have been exerted. Further, in a case where the removable adhesive layer is energy ray-curable, the removable adhesive layer is in a state before curing by energy irradiation described below. The removable adhesive layer after curing by energy irradiation is referred to as a cured removable adhesive layer.

In the present invention, the adhesive layer means a coating layer of the adhesive composition, and is in a state in which a resin contained in the adhesive composition is exerting an adhesive power and a coagulation power. In a case where a thermopolymerizable component described below is contained in the adhesive composition, the adhesive layer is in a state before semi-curing by heat at the time of die bonding described below. The adhesive layer after semi-curing by heat is referred to as a semi-cured adhesive layer.

Hereinafter, explanations will be given about the compositions of each layer of the semiconductor-processing tape.

<Base Material Film>

It is preferable that the base material film 11 is easy to be extended and is not fractured, in the expansion process of the semiconductor-processing tape 10. Further, in order to divide uniformly an adhesive layer, it is preferable that a stress due to expansion is fully transmitted to the adhesive layer. From these points of view, the stress values in MD and TD of the base material film 11 at the time of 5%-elongation are each 5 MPa or more, and more preferably 6 MPa or more. The upper limit of the stress values in MD and TD of the base material film at the time of 5%-elongation are not particularly limited. However, 100 MPa is practical. In the present invention, the MD (Machine direction) means a length direction of a base material film formed in a roll. On the other hand, the TD (Transverse Direction) means an orthogonal direction (width direction) to the MD (the same goes for the tensile strength at the time of 5%-elongation described below).

A ratio (MD/TD) of the stress values in MD and TD at the time of 5%-elongation is preferably from 0.8 to 1.

The tensile strength in MD and TD of the base material film 11 at the time of 5%-elongation are each from 10 to 30 N/25 mm. If the above-described tensile strength is too small, a power is insufficient for division and therefore division of the adhesive layer sometimes becomes insufficient. On the other hand, if the tensile strength is too large, expansion cannot be well performed even by the use of an expander, so that this sometimes causes problems that a space between semiconductor chips is not at all opened or an apparatus failure is occurred. The tensile strength in MD and TD of the base material film 11 at the time of 5%-elongation are each preferably from 15 to 25 N/25 mm.

A ratio (MD/TD) of the tensile strength in MD and TD at the time of 5%-elongation is preferably from 0.85 to 1.15.

On the other hand, the thickness of the base material film 11 is from 70 to 150 μm. If the thickness of the base material film 11 is too thin, the base material film 11 is sometimes fractured, or because a tensile strength is not sufficiently obtained, sometimes division by expansion cannot be achieved. If the thickness of the base material film 11 is too thick, even if both the stress value at the time of 5%-elongation and the tensile strength at the time of 5%-elongation are within the above-described ranges, the deformation amount is insufficient relative to the elongation amount in the division by expansion, and because a space between semiconductor chips is not adequately opened, sometimes the adhesive layer cannot be divided. Further, at the time of pick-up, the base material film 11 is difficult to deform and a pick-up property deteriorates, and this sometimes causes a pick-up failure and a fracture of the semiconductor chips. The thickness of the base material film 11 is more preferably from 80 to 120 μm.

As described below, in a case where the base material film is a laminate body having a multi-layer structure, the laminate body has the above-described stress value in MD and TD at the time of 5%-elongation and tensile strength in MD and TD at the time of 5%-elongation. Further, the above-described laminate body has the above-described thickness.

The flexural modulus of the base material film 11 is preferably 200 MPa or less in a point of easy lamination. The flexural modulus can be measured by the following method. The flexural modulus is a ratio of the stress to the strain within the elastic limit (measured in the elastic mode) and is similar to a tensile modulus. This characteristic is used to show a flexural rigidity of the material. The flexural modulus is a modulus relating to elasticity and is determined by calculating a gradient of a straight line portion of the stress-strain curve in the bending test. The formula used in calculating the flexural modulus (EB) from a recorded load (F) and a deviation (D) is the following one.

$$EB=(3/4)\cdot(FL^3/bd^3D)$$

Herein, L, b and d each represent the followings.
L=a span (m) between supports of the sample
B=width (m) of the sample
D=length (m) of the sample The flexural modulus can be measured in conformity to ASTM D790 Standards or the like.

The above-described characteristics can be set to the above-described ranges by adjusting, for example, a type and a content of the material, a thickness or the like of the base material film in accordance with an ordinary method.

The quality of the materials for the base material film is not particularly limited, as long as the material allows achievement of the above-described stress values and tensile strength in MD and in TD at the time of 5%-elongation. The base material film 11 having a homogeneous and isotropic expandability is preferable in the point that a wafer can be divided omnidirectionally and in an unbiased way. In general, the crosslinked resin has a larger restoring force against tension and has a larger shrinkage stress when heat is applied to the extended state after the expansion process, as compared with the non-crosslinked resin. Accordingly, the crosslinked resin is preferable in the point that a heat-shrinking process of subjecting a tape to heat shrinkage is enforceable, whereby laxation caused in the tape after the expanding process can be eliminated and an individual space between semiconductor chips can be stably maintained due to tension given to the tape. Of the crosslinked resin, a thermoplastic crosslinked resin is more preferably used. On the other hand, the non-crosslinked resin has a smaller restoring force against tension, as compared with the crosslinked resin. Accordingly, the non-crosslinked resin is preferable in the point that adhesive layers laminated on the semiconductor chips can be prevented from being contacted each other, because after the expansion process in the temperature region of as low as −15 to 0° C., the tape, which has been once relaxed and then has been set back to room temperature and then is heading to a pick-up process and a mounting process, is difficult to shrink. Of the non-crosslinked resin, an olefin-based non-crosslinked resin is more preferably used.

As the thermoplastic crosslinked resin, an ionomer resin, which is a synthetic resin of polymer aggregates formed using a coagulation power due to metallic ions, is preferable. Examples thereof include ionomer resins obtained by cross-linking an ethylene-(meth)acrylic acid bicopolymer or an ethylene-(meth)acrylic acid-(meth)acrylic acid alkyl, ester tercopolymer, through a metal ion. These are suitable for the expansion process in terms of a homogeneous expandability and also are particularly preferable in the point that a restoring force due to heat becomes more functional by the crosslinkage. The metal ion contained in the above-described ionomer resin is not particularly limited. However, examples thereof include a zinc ion, a sodium ion and the like. The zinc ion has a low elution property and is preferable from the viewpoint of low staining properties. In the present invention, the ionomer resin containing a zinc ion is referred to as a zinc ionomer resin. In the (meth)acrylic acid alkyl ester of the above-described tercopolymer, it is preferable that the alkyl group has a carbon number of 1 to 4, because an elastic modulus (flexural modulus) of the base material film to be obtained becomes high, whereby a strong power can be transmitted to a wafer. Examples of the (meth)acrylic acid alkyl ester include methyl methacrylate, ethyl methacrylate, propyl methacrylate, butyl methacrylate, methyl acrylate, ethyl acrylate, propyl acrylate, butyl acrylate, and the like.

Further, aside from the above-described ionomer resin, as the above-described thermoplastic crosslinked resin, a cross-linked product of a resin selected from a low-density polyethylene having a specific gravity of 0.910 or more and less than 0.930, an ultralow-density polyethylene having a specific gravity of less than 0.910, and ethylene-vinyl acetate copolymer, is also preferable.

Examples of a crosslinking method include a method of irradiating energy rays such as a beam of electrons and the like to the above-described resin. The thermoplastic crosslinked resin has a certain homogeneous expandability, coming from a crosslinking site and a non-crosslinking site that are coexistent with each other in the resin. Further, the thermoplastic crosslinked resin is also preferable in eliminating laxation, coming from an event that a restoring force strongly functions by heat. Further, the forgoing thermoplastic crosslinked resin contains little or no chlorine atom in the constitution of the molecular chain. Accordingly, even if a tape which became unnecessary after use is incinerated, the tape does not generate chlorinated aromatic hydrocarbons such as dioxins and their analogue, which also results in reduction of environmental burdens. A resin having an adequate and homogeneous expandability can be obtained by appropriately adjusting an energy dose to be irradiated to the above-described polyethylene or ethylene-vinyl acetate copolymer.

Further, examples of the non-crosslinked resin include a mixed resin of polypropylene and a styrene-series copolymer.

As polypropylene, for example, a polypropylene homopolymer, or a polypropylene copolymer, for example, a block-type or random-type propylene-ethylene copolymer may be used. The random-type propylene-ethylene copolymer is preferable, because it exerts a low stiffness property. It is preferable that a content of the ethylene-constituent unit in the propylene-ethylene copolymer is 0.1% by mass or more, in the points that a stiffness property of the base material film is low and compatibility of resins in a mixed resin is high. If the stiffness property of the base material film is adequate, a dividing property of the wafer is improved. If the compatibility of resins is high, an extrusion discharge quantity is easily stabilized. The content is more preferably 1% by mass or more. On the other hand, it is preferable that the content of the ethylene-constituent unit in the propylene-ethylene copolymer is 7% by mass or less in the points that a polymerization reaction for obtaining the propylene-ethylene copolymer can be stably performed. The content is more preferably 5% by mass or less.

The styrene-series copolymer means a copolymer of a conjugated diene compound and an aromatic vinyl compound. Examples of the aromatic vinyl compound include styrene, t-butyl styrene, α-methyl styrene, p-methyl styrene, divinyl benzene, 1,1-diphenyl styrene, N,N-diethyl-p-aminoethyl styrene, vinyl toluene, p-tertiarybutyl styrene, and the like. Further, examples of the conjugated diene compound include butadiene, isoprene, 1,3-pentadiene, 2,3-dimethyl-1,3-butadiene, and the like.

As the styrene-series copolymer, its hydrogenated product may be used and a styrene-hydrogenated isoprene-styrene copolymer is preferable. If the styrene copolymer is hydrogenated, compatibility with polypropylene becomes well, and embrittlement and change of color due to oxidation degradation caused by a double bond in the main chain can be prevented.

Further, a content of the styrene-constituent unit in the styrene-series copolymer is preferably 5% by mass or more in the point that polymerization is stably performed in preparation of the styrene-series copolymer. Further, if the content is 40% by mass or less, the styrene-series copolymer is soft and exerts a high expandability, and the content is more preferably 25% by mass or less, and still more preferably 15% by mass or less.

As for the styrene-series copolymer, any of a block-type copolymer and a random-type copolymer may be used. The random-type copolymer is preferable in the points that its styrene-constituent unit is homogeneously dispersed, whereby over-stiffness property can be suppressed, which results in improvement of expandability of the base material film.

A content of the polypropylene in a mixed resin of polypropylene and a styrene-series copolymer is preferably 30% by mass or more in the point that a thickness unevenness of the base material film can be suppressed. If the thickness of the base material film is even, expandability easily becomes isotropic. Further, with the above-described content, it is easy to prevent the event that a stress relaxation property becomes overly increased, so that a space between semiconductor chips becomes narrow with age, whereby adhesive layers are brought into contact, which results in second fusion bonding. The content of the polypropylene is more preferably 50% by mass or more. Further, if the content of the polypropylene is 90% by mass or less, a stiffness property of the base material film can be adequately set. If the stiffness property of the base material film becomes too large, a power necessary for expanding the base material film becomes large. Concomitantly, a load to the apparatus becomes large, and sometimes expansion adequate for division of the wafer or the adhesive layer cannot be performed. The lower limit of the content of the styrene-series copolymer in a mixed resin is preferably 10% by mass or more, which allows easy adjustment to a stiffness property of the base material film suitable for the apparatus. The upper limit thereof is preferably 70% by mass or less in the point that thickness unevenness can be suppressed, and the upper limit of 50% by mass or less is more preferable.

A preferable range of the melting point of the crosslinked resin and the non-crosslinked resin is from 80 to 95° C. If the melting point is too low, a base material film is adhered to a laminating roller by a heat lamination in laminating a semiconductor-processing tape. On the other hand, if the melting point of the crosslinked resin and the non-crosslinked resin is too high, heat shrink properties become insufficient at a heating temperature which is applied in the heat shrinking process after the expanding division described below, so that the semiconductor-processing tape becomes unshrinkable in the heat shrinking process after the expanding division. Further, a preferable range of the melt-flow rate (MFR) of the crosslinked resin and the non-crosslinked resin is from 0.5 to 5.5 g/10 min. If MFR is too low, accuracy of the thickness in extrusion becomes worse, which leads in part to extreme deterioration of pick-up property. On the other hand, if MFR is too large, the resin becomes fatigued to shrink insufficiently, because a flow property is too high. MFR is defined as a value measured in conformity with JIS K 7210-1999. The measuring condition of MFR, although it varies depending on the material to be used, is adequately determined in accordance with the description of JIS K 7210-1999.

In a case where a base material film contains a thermoplastic crosslinked resin, the base material film may contain a resin other than the thermoplastic crosslinked resin. However, it is preferable to contain the thermoplastic crosslinked resin as a main component. Herein, the main component means a component which accounts for the maximum content (preferably 50% by mass or more) in the resin components which constitutes the base material film.

A preferable embodiment of the base material film is a base material film containing a thermoplastic crosslinked resin as a main component, in which a melting point of the thermoplastic crosslinked resin is from 80 to 95° C. and a melt-flow rate thereof is from 0.5 to 5.5 g/10 min.

A more preferable embodiment of the base material film is a base material film in which the thermoplastic crosslinked resin in the above-described preferable embodiment is an ionomer resin, and a flexural modulus of the base material film is 200 MPa or less.

Meanwhile, in the example shown in FIG. 1, the base material film 11 is a single layer. However, the base material film is not limited thereto, but may be multilayers. The multilayers may be multilayers in which at least 2 types of layers each composed of a resin are stacked, or may be multilayers in which more than one layer each composed of one type of resin are stacked. It is preferable that crosslinked resins or alternatively non-crosslinked resins as the at least 2 types of resins are adopted, from the viewpoint that each characteristic is expressed in more intensified manner. A case where a crosslinked resin and a non-crosslinked resin are stacked in combination is preferable in the point that each defect is complemented to each other.

As a method of producing the base material film 11 having multiple layers, an ordinary method such as an extrusion method, a laminate method, and the like can be used. In a case of using a laminate method, an adhesive may be mediated between layers. As the adhesive, ordinary ones may be used.

<Removable Adhesive Layer>

The removable adhesive layer 12 which constitutes the semiconductor-processing tape 10 of the present invention is not particularly limited, as long as it has a retention property achieving a degree of generating no failure such as semiconductor chip flying, without causing separation from the adhesive layer 13 in the dicing process; a characteristic of transmitting a stress due to expansion into the adhesive layer; and a characteristic of being separable from the adhesive layer 13 in the pick-up.

In the semiconductor-processing tape 10 of the present invention, a removable adhesive which constitutes the removable adhesive layer 12 is not particularly limited, as long as it has the above-described characteristics. However, an energy ray-curable removable adhesive is preferable. By the energy ray-curable removable adhesive, a pick-up after dicing becomes easy to perform. Further, a material that makes it easy to separate from the adhesive layer 13 after curing is preferable. Meanwhile, herein, the energy ray means a light ray such as ultraviolet ray, or an ionizing radiation such as electron beam.

As the removable adhesive, an energy ray-curable removable adhesive is preferable and a removable adhesive containing at least one type of a polymer (hereinafter referred to as "polymer (A)") having at least one reactive group which is capable of polymerization reaction induced by an energy ray irradiation is preferable.

The above-described removable adhesive is preferably composed of the polymer (A) as a main component. More specifically, the polymer (A) is preferably contained in a rate of 50% by mass or more, more preferably 80% by mass or more, and still more preferably 90% by mass or more.

As the above-described reactive group which is capable of polymerization reaction induced by an energy ray irradiation, an ethylenically unsaturated group, namely a group having a carbon-carbon double bond is preferable. Examples thereof include a vinyl group, an allyl group, a styryl group, a (meth)acryloyloxy group, a (meth)acryloylamino group, and the like.

The above-described polymer (A) is not particularly limited. However, examples thereof include (meth)acrylic polymers, polyesters, ethylene or styrene copolymers, polyurethanes, and the like. Meanwhile, in the present invention, as the forgoing polymer (A), one kind may be used alone, or more than one kind may be used in combination.

In the removable adhesive layer, a (meth)acrylic polymer having a mass-average molecular weight of 10,000 or more and 2,000,000 or less is preferably contained as a polymer (A). This (meth)acrylic polymer preferably has an ethylenically unsaturated group, a hydroxy group, and a carboxy group.

As the above-described (meth)acrylic polymer having a mass-average molecular weight of 10,000 or more and 2,000,000 or less, a marketed product may be used, or a conventionally synthesized product may be used. In a case of synthesis, the above-described (meth)acrylic polymer is preferably a polymer obtained by a reaction of a compound having the ethylenically unsaturated group and a polymer before introducing an ethylenically unsaturated group thereto and having a hydroxy group and a carboxy group. In this case, it is preferable to contain (meth)acrylic acid in a rate of 1 mole % to 10 mole % in a total of monomer components forming the polymer before introducing an ethylenically unsaturated group thereto.

In the present invention, as the compound having the ethylenically unsaturated group, a reaction product of a compound having a hydroxy group as a reactive group described below with 2-(meth)acryloyloxyethyl isocyanate described below is preferable.

Meanwhile, in the present invention, a blended amount of 2-(meth)acryloyloxyethyl isocyanate is preferably from 1 part by mass to 20 parts by mass and more preferably from 6 parts by mass to 20 parts by mass, with respect to 100 parts by mass of the polymer (A).

As a synthetic method of the above-described polymer (A), for example, (a) in a case of polymer having an ethylenically unsaturated group, a method of reacting a compound having the ethylenically unsaturated group and a polymer thereby obtaining a polymer in which the ethylenically unsaturated group has been introduced and (b) a method of using an oligomer having an ethylenically unsaturated group (for example, urethane (meth)acrylate oligomer or the like which is a kind of crosslinking agents) are preferable because of simplicity and easiness. In particular, the above-described method (a) is preferable.

In the above-described method (a), by using, as a compound having the ethylenically unsaturated group, a compound of the structure having said ethylenically unsaturated group and a reactive group (called as a reactive group α) which is different from the ethylenically unsaturated group (hereinafter, also referred to as a compound having an ethylenically unsaturated group and a reactive group α), and also by using, as a polymer to which an ethylenically unsaturated group is going to be introduced, a polymer of the structure having a reactive group β which reacts with the reactive group α of the compound having said ethylenically unsaturated group (hereinafter, referred to as a polymer having a reactive group β), the reactive group α and the reactive group β are subjected to a reaction.

The forgoing reactive group α and reactive group β are preferably selected so that, for example, one of these groups is a nucleophilic attacking group, and the other is a nucleophilic attack-receiving group or an addition reaction-receiving group. Examples of the forgoing reactive groups include a hydroxy group, an amino group, a mercapto group, a carboxy group, an epoxy group, an oxetanyl group, an isocyanate group, a cyclic acid anhydride group, a halogen atom, an alkoxy-or aryloxy-carbonyl group, and the like.

Herein, in a case where either one of the reactive group α and the reactive group β is a hydroxy group, an amino group, a mercapto group, or a carboxy group, the other reactive group may be selected from the group consisting of an epoxy group, an oxetanyl group, an isocyanate group, a cyclic acid anhydride group, a halogen atom, and an alkoxy-or aryloxy-carbonyl group.

The reactive group α of the compound having both an ethylenically unsaturated group and a reactive group α is preferably a nucleophilic attack-receiving group or an addition reaction-receiving group. For example, an epoxy group, an oxetanyl group, an isocyanate group, a cyclic acid anhydride group, a halogen atom, or an alkoxy-or aryloxy-carbonyl group is preferable; an epoxy group, an oxetanyl group, an isocyanate group, or a cyclic acid anhydride group is more preferable; an epoxy group, an oxetanyl group, or an isocyanate group is still more preferable; and an isocyanate group is particularly preferable.

On the other hand, the reactive group β of the polymer having a reactive group β is preferably a nucleophilic attacking group. For example, a hydroxy group, an amino group, a mercapto group, or a carboxy group is preferable; a hydroxy group, an amino group, or a mercapto group is more preferable; a hydroxy group, an amino group or a carboxy group is still more preferable; a hydroxy group or a carboxy group is still more preferable; and particularly a hydroxy group is preferable.

Examples of the compound having an ethylenically unsaturated group and a reactive group α, or the monomer having the reactive, group β used for synthesis of the polymer having a reactive group β include the following compounds.

—Compound Whose Reactive Group is a Carboxy Group—
(meth)acrylic acid, cinnamic acid, itaconic acid, fumaric acid, and the like —Compound Whose Reactive Group is a Hydroxy Group—
Hydroxyalkyl (meth)acrylates having a hydroxy group in its alcohol portion [for example, 2-hydroxyethyl (meth)acrylate, 2-hydroxypropyl (meth)acrylate, trimethylolpropane mono (meth)acrylate, glycol mono (meth)acrylate, diethyleneglycol mono (meth)acrylate], (meth)acrylamides of an alkyl amine having a hydroxy group in its amine portion [for example, N-mono or di (hydroxyalkyl) (meth)acrylamides, specifically, N-methylol (meth)acrylamide, N,N-bismethylol (meth)acrylamide], allyl alcohol, and the like —Compound Whose Reactive Group is an Amino Group—
Aminoalkyl (meth)acrylates having an amino group in its alcohol portion [for example, 2-(alkylamino) ethyl (meth)acrylate, 3-(alkylamino) propyl (meth)acrylate], (meth)acrylamide, and the like —Compound Whose Reactive Group is a Cyclic Acid Anhydride—
Maleic anhydride, itaconic anhydride, fumaric anhydride, phthalic anhydride, and the like —Compound Whose Reactive Group is an Epoxy Group or an Oxetanyl Group—
Glycidyl (meth)acrylate, allylglycidyl diether, 3-ethy-3-hydroxymethyl oxetane, and the like —Compound Whose Reactive Group is an Isocyanate Group—
(Meth)acryloyloxyalkyl isocyanate [for example, 2-(meth)acryloyloxyethyl isocyanate, 2-(meth)acryloyloxypropyl isocyanate], a polyisocyanate compound whose isocyanate groups have been partially urethanated with a compound having a hydroxy group or carboxy group and an ethylenically unsaturated group [for example, from 2 to 10 functional (meth)acrylic urethane acrylate oligomer], and the like.

Meanwhile, as the above-described urethane acrylate oligomer, preferred are oligomers having at least one isocyanate group, which are obtained by, for example, reacting hydroxyalkyl (meth)acrylates having a hydroxy group in its alcohol portion such as 2-hydroxyethyl (meth)acrylate, 2-hydroxypropyl (meth)acrylate, or pentaerythritol tri (meth)acrylate, with diisocyanates such as toluene diisocyanate, methylene bisphenyl diisocyanate, hexamethylene diisocyanate, naphthalene diisocyanate, methylene biscyclohexyl isocyanate, or isophorone diisocyanate, or 3 or more multifunctional isocyanate. Further, the oligomer may be ones obtained by additionally reacting a polyol compound, a polyether diol compound, or a polyester diol compound and both the hydroxyalkyl (meth)acrylate and the polyisocyanate.

—Compound Whose Reactive Group is a Halogen Atom—
Halogenated triazines such as 2,4,6-trichloro-1,3,5-triazine, 2,4-dichloro-6-methoxy-1,3,5-triazine, and the like As the above-described compound having an ethylenically unsaturated group and a reactive group α, the above-described "compound whose reactive group is an isocyanate group" is preferable. On the other hand, as a monomer for use in synthesis of the polymer having a reactive group β, the above-described "compound whose reactive group is a carboxy group" or "compound whose reactive group is a hydroxy group" is preferable, and "compound whose reactive group is a hydroxy group" is more preferable.

In the above-described method (b), the above-described urethane (meth)acrylate oligomer is used (said oligomer is also a kind of crosslinking agents as described below). According to this method, an energy ray-curable pressure sensitive adhesive layer can be constituted by incorporating therein a (meth)acrylic copolymer together with the urethane (meth)acrylate oligomer. As the (meth)acrylic copolymer, those obtained by polymerizing (meth)acrylic acid and (meth)acrylic acid esters are preferable. A preferred form of the (meth)acrylic acid ester component which constitutes the (meth)acrylic copolymer is the same as those described as the copolymer component of the polymer having a reactive, group β described below.

A proportion of a monomer component having the above-described reactive group β to total monomer components which constitute the above-described polymer having a reactive group β is preferably from 5 to 50% by mole and more preferably from 20 to 40% by mole.

In reacting a compound having both an ethylenically unsaturated group and a reactive group α and a polymer having a reactive group β, thereby introducing the ethylenically unsaturated group into the polymer having a reactive group β, the compound having both an ethylenically unsaturated group and a reactive group α is preferably reacted in a proportion of 1 to 40 parts by mass, more preferably from 1 to 30 parts by mass, still more preferably from 1 to 20 parts by mass, and particularly preferably from 1 to 10 parts by mass, with respect to 100 parts by mass of the polymer having a reactive group β.

After reaction of the above-described reactive groups α and β, by leaving behind an unreacted reactive group β, resin characteristics can be adjusted in accordance with a crosslinking agent and the like described below.

The above-described polymer having a reactive group β preferably has a (meth)acrylic acid ester component as a copolymer component together with a monomer component having the above-described reactive group β as a structural component of the polymer.

As said (meth)acrylic acid ester, one or more than one type of alkyl (meth)acrylate is preferable. The alcohol portion of said (meth)acrylic acid ester does not have the above-described reactive group β. The alcohol portion of the above-described (meth)acrylic acid ester is preferably unsubstituted.

As the forgoing (meth)acrylic acid ester, the carbon number of the alcohol portion is preferably from 1 to 12. The carbon number of the alcohol portion is more preferably from 1 to 10, still more preferably from 4 to 10. Especially, the alcohol portion is preferably composed of a branched alkyl moiety. In particular, 2-ethylhexyl (meth)acrylate is preferable.

In a case where the above-described copolymer (A) contains more than one type of (meth)acrylic acid ester components as a structural component, a (meth)acrylic acid ester component whose alcohol portion has from 1 to 8 carbon atoms is preferably contained in said (meth)acrylic acid ester component. In particular, an ethyl (meth)acrylate component is preferably contained.

Hereinafter, specific examples of monomers to be incorporated in the polymer as the above-described copolymer component are exemplified. —Alkyl Ester of (Meth)Acrylic Acid—

As an alkyl ester of (meth)acrylic acid, those in which the carbon number of its alcohol portion is from 1 to 12 are preferable. Examples thereof include methyl (meth)acrylate, ethyl (meth)acrylate, propyl (meth)acrylate, butyl (meth) acrylate, isobutyl (meth)acrylate, isoamyl (meth)acrylate, hexyl (meth)acrylate, 2-ethyl hexyl (meth)acrylate, isooctyl (meth)acrylate, isononyl (meth)acrylate, isodecyl (meth) acrylate, and the like. These may be used alone or in a mixture of 2 or more kinds. The use in combination of 2 or more kinds allows exertion of various functions as a removable adhesive, and further achieves a balance between a following property for the level differences on the wafer surface and non-staining property including prevention of adhesive deposit.

—Monomers Other than Alkyl Ester of (Meth)Acrylic Acid—

Examples of monomers other than the alkyl ester of (meth)acrylic acid include vinyl acetate, styrene, (meth) acrylamides, for example, N,N-diethyl acrylamide, N,N-diethyl acrylamide, N-isopropyl acrylamide, N-acryloyl morpholine, and the like. These may be used alone or in a mixture of 2 or more kinds.

A proportion of the above-described copolymer component to a total of monomer components which constitute the above-described polymer having a reactive group β is preferably from 5 to 50% by mole and more preferably from 20 to 40% by mole.

Further, in the semiconductor-processing tape 10 of the present invention, the removable adhesive which constitutes a removable adhesive layer 12 may contain the polymer (A) and further a compound (B) which acts as a crosslinking agent. Examples of the compound (B) include polyisocyanates, melanin-formaldehyde resins, and an epoxy resins. These may be used alone or in combination of 2 or more kinds. This compound (B) reacts with the polymer (A). By a crosslinking structure resulting from the reaction, a cohesion force of the removable adhesive containing both the polymer (A) and the compound (B) can be improved after coating a removable adhesive composition. The removable adhesive composition is described later.

The polyisocyanates are not particularly limited. Examples thereof include aromatic isocyanates, such as 4,4'-diphenylmethanediisocyanate, tolylenediisocyanate, xylylenediisocyanate, 4,4'-diphenyl ether diisocyanate, and 4,4'-[2,2-bis(4-phenoxyphenyl)propane]diisocyanate; hexamethylenediisocyanate, 2,2,4-trimethyl-hexamethylenediisocyanate, isophoronediisocyanate, 4,4'-dicyclohexylmethanediisocyanate, 2,4'-dicyclohexylmethanediisocyanate, lysinediisocyanate, and lysinetriisocyanate. Specifically, a commercially available product, such as Coronate L (trade name, manufactured by Nippon Polyurethane Industry Co., Ltd.) and the like, may be used. Further, as the melamine/formaldehyde resin, for example, commercial products, such as Nikarack MX-45 (trade name, manufactured by Sanwa Chemical Co., Ltd.), or Melan (trade name, manufactured by Hitachi Chemical Co., Ltd.), may be used. As the epoxy resin, for example, TETRAD-X (trade name, manufactured by Mitsubishi Chemical Co., Ltd.), may be used. Particularly, a polyisocyanate is preferably used in the present invention.

The removable adhesive layer in which the compound (B) is contained in an addition amount of 0.1 parts by mass or more with respect to 100 parts by mass of the polymer (A) is preferable in terms of cohesion force. A more preferable addition amount is 0.5 parts by mass or more. On the other hand, the removable adhesive layer in which the addition amount of the compound (B) is set to 15 parts by mass or less is preferable in terms of suppressing a rapid gelation at the time of coating, whereby workability such as blending of the removable adhesive, coating and the like are improved. A more preferable addition amount is 5 parts by mass or less.

Further, in the present invention, in the removable adhesive which constitutes the removable adhesive layer 12, an energy ray polymerization initiator (C) may be contained. The energy ray polymerization initiator (C) contained in the removable adhesive layer is not particularly limited, and any one known in the prior art may be used. Examples of the photopolymerization initiator (C) may include benzophenones, such as benzophenone, 4,4'-dimethylaminobenzophenone, 4,4'-diethylaminobenzophenone, and 4,4'-dichlorobenzophenone; acetophenones, such as acetophenone, and diethoxyacetophenone; anthraquinones, such as 2-ethylanthraquinone, and t-butylanthraquinone; 2-chlorothioxanthone, benzoin ethyl ether, benzoin isopropyl ether, benzyl, 2,4,5-triarylimidazole dimer (lophine dimer), and acridine type compounds. These compounds may be used either singly or in combination of two or more.

As an addition amount of the energy ray polymerization initiator (C), said initiator is preferably blended in a proportion of 0.1 parts by mass or more and more preferably 0.5 parts by mass or more, with respect to 100 parts by mass of the polymer (A). Further, the upper limit thereof is preferably 10 parts by mass or less and more preferably 5 parts by mass or less.

The removable adhesive composition may be prepared as needed by adding a solvent normally employed, to the above-described removable adhesive.

Further, the removable adhesive composition that can be used in the present invention may be blended with a tackifier, a removable adhesion regulator, a surfactant, and other modifier, according to the need. Further, an inorganic compound filler may be added arbitrarily.

The removable adhesive layer 12 may be formed using a method of forming an ordinary removable adhesive layer. For example, the removable adhesive layer 12 can be formed on a base material film 11 by a method of preparing a removable adhesive composition containing the above-described removable adhesive, and then coating said removable adhesive composition on a predetermined surface of the base material film 11 to form the removable adhesive layer, or by a method of coating the above-described removable adhesive composition on a separator (for example, a plastic film or sheet having a release agent coated thereon) to form the removable adhesive layer 12, and then transferring said removable adhesive layer 12 to a predetermined surface of the base material film 11. Meanwhile, the removable adhesive layer 12 may have a form of single layer or a multi-layered form.

The thickness of the removable adhesive layer 12 is not particularly limited. However, the thickness of 2 μm or more is preferable in terms of tack power and the thickness of 5 μm or more is more preferable. The thickness of 20 μm or less is preferable in terms of pick-up property and the thickness of 15 μm or less is more preferable.

<Adhesive Layer>

In the semiconductor-processing tape 10 of the present invention, an adhesive layer 13 is laminated with a wafer thereon and is subjected to dicing, and then is divided along semiconductor chips by expansion of the semiconductor-processing tape, and when the semiconductor chips are picked up, said adhesive layer is separated from the removable adhesive layer 12 and adheres to the semiconductor chips (the adhesive layer is left on the semiconductor chips). Further, the adhesive layer is used as an adhesive in fixing the semiconductor chips on a substrate or a lead frame.

The adhesive layer 13 for use in the present invention has the characteristics that the thickness is 40 μm or more and the storage elastic modulus at 25° C. described below is 2000 MPa or less.

The thickness of the adhesive layer is preferably from 40 to 200 μm and more preferably from 40 to 100 μm.

The storage elastic modulus of the adhesive layer at 25° C. is preferably from 0.1 to 1000 MPa and more preferably from 0.5 to 100 MPa.

The wafer processing removable adhesive tape of the present invention allows provision of a thick adhesive layer having a low storage elastic modulus. The use of the thick adhesive layer having a low storage elastic modulus makes it easy to embed a wire in the adhesive layer, or facilitates a follow-up of said adhesive layer to concavity and convexity of the wafer surface (concavity and convexity due to a wire circuit of the substrate and/or a underlying gold wire attached to the semiconductor chips). If the adhesive layer is too thin, sometimes a space for embedding a wire cannot be ensured. On the other hand, if the storage elastic modulus of the adhesive layer at 25° C. is too large, sometimes the following property to the concavity and convexity on the wafer becomes inadequate, or fluidity cannot be exerted, whereby embedding property of the wire becomes inadequate.

The storage elastic modulus of the adhesive layer at 70° C. is preferably from 10000 to 100000 Pa and more preferably from 30000 to 80000 Pa. If the storage elastic modulus of the adhesive layer at 70° C. is within a range of 10000 to 100000 Pa, the adhesive layer can be adequately attached to a wafer even if the wafer has an electrode.

The storage elastic modulus of the adhesive layer at 25° C. and 70° C. can be set to the above-described ranges by an ordinary method, for example, by adjusting a type and a content of the raw material and a thickness and the like of the adhesive layer.

In the semiconductor-processing tape of the present invention, the adhesive layer preferably has a pressure-sensitive property, and more preferably has both a pressure-sensitive property and a thermosetting property.

The adhesive of the adhesive layer 13 preferably contains a thermoplastic resin and a thermopolymerizable component. In a case of containing a thermopolymerizable component, it is preferable to polymerize the thermopolymerizable component by heat in the die bonding process, thereby bringing out adhesion power.

As the thermoplastic resin for use in the adhesive layer 13 in the present invention, a resin having thermoplasticity, or a resin having thermoplasticity in a non-crosslinked state, and then forming a crosslinked structure after heating, is preferable. Although there is no particular limitation, as one embodiment, a thermoplastic resin having a mass-average molecular weight of 5,000 to 200,000 and a glass transition temperature of 0 to 150° C. is exemplified. Further, as another embodiment, a thermoplastic resin having a mass-average molecular weight of 100,000 to 1,000,000 and a glass transition temperature of −50 to 20° C. is exemplified.

Examples of the resin having thermoplasticity include a polyimide resin, a polyamide resin, a polyetherimide resin, a polyamideimide resin, a polyester resin, a polyesterimide resin, a phenoxy resin, a polysulfone resin, a polyethersulfone resin, a polyphenylenesulfide resin, a polyetherketone resin, and the like. In particular, a polyimide resin or a phenoxy resin is preferably used.

As a resin having thermoplasticity in a non-crosslinked state, and forming a crosslinked structure after heating, a polymer having a functional group is preferably used.

The polyimide resin can be obtained by the condensation reaction of a tetracarboxylic dianhydride and a diamine in accordance with an ordinary method. Specifically, using tetracarboxylic dianhydride and diamine in equimolar amounts or almost equimolar amounts, in an organic solvent (the addition order of these components is arbitrary), these components are subjected to the addition reaction at reaction temperature of 80° C. or less, preferably from 0 to 60° C. As the reaction progresses, the viscosity of the reaction liquid gradually increases, to produce a polyamide acid which is a precursor of the polyimide. This polyamide acid is subjected to depolymerization by heating at a temperature of 50 to 80° C., whereby its molecular weight can be also adjusted. The polyimide resin can be obtained by the dehydration ring closure of the above-described reactant (polyamide acid). The dehydration ring closure can be performed by a thermal ring closure method by a thermal treatment, or a chemical ring closure method using a dehydrating agent.

The tetracarboxylic dianhydride used as a raw material of the polyimide resin is not particularly limited. For example, the use can be made of 1,2-(ethylene) bis(trimellitate anhydride), 1,3-(trimethylene) bis(trimellitate anhydride), 1,4-(tetramethylene) bis(trimellitate anhydride), 1,5-(pentamethylene) bis(trimellitate anhydride), 1,1-(hexamethylene) bis(trimellitate anhydride), 1,7-(heptamethylene) bis(trimellitate anhydride), 1,8-(octamethylene) bis(trimellitate anhydride), 1,9-(nonamethylene) bis(trimellitate anhydride), 1,10-(decamethylene) bis(trimellitate anhydride), 1,12-(dodecamethylene) bis(trimellitate anhydride), 1,16-(hexadecamethylene) bis(trimellitate anhydride), 1,18-(octadecamethylene) bis(trimellitate anhydride), pyromellitate dianhydride, 3,3',4,4'-biphenyl tetracarboxylic dianhydride, 2,2',3,3'-biphenyl tetracarboxylic dianhydride, 2,2-bis(3,4-dicarboxyphenyl) propane dianhydride, 2,2-bis(2,3-dicarboxyphenyl) propane dianhydride, 1,1-bis(2,3-dicarboxyphenyl) ethane dianhydride, 1,1-bis(3,4-dicarboxyphenyl) ethane dianhydride, bis(2,3-dicarboxyphenyl) methane dianhydride, bis(3,4-dicarboxyphenyl) methane dianhydride, bis(3,4-dicarboxyphenyl) sulfone dianhydride, 3,4,9,10-perylene tetracarboxylic dianhydride, bis(3,4-dicarboxyphenyl) ether dianhydride, benzene-1,2,3,4-tetracarboxylic dianhydride, 3,4,3',4'-benzophenone tetracarboxylic dianhydride, 2,3,2',3'-benzophenone tetracarboxylic dianhydride, 3,3,3',4'-benzophenone tetracarboxylic dianhydride, 1,2,5,6-naphthalene tetracarboxylic dianhydride, 1,4,5,8-naphthalene tetracarboxylic dianhydride, 2,3,6,7-naphthalene tetracarboxylic dianhydride, 1,2,4,5-naphthalene tetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-bisphenyl tetracarboxylic dianhydride, 3,4,3',4'-biphenyl tetracarboxylic dianhydride, 2,3,2',3'-biphenyl tetracarboxylic dianhydride, bis(3,4-dicarboxyphenyl) dimethylsilane dianhydride, bis(3,4-dicarboxyphenyl) methylphenylsilane dianhydride, bis(3,4-dicarboxyphenyl) diphenylsilane dianhydride, 1,4-bis(3,4-dicarboxyphenyldimethylsilyl) benzene dianhydride, 1,3-bis(3,4-dicarboxyphenyl)-1,1,3,3,-tetramethyldicyclohexane dianhydride, p-phenylene bis(trimellitate anhydride), ethylene tetracarboxylic dianhydride, 1,2,3,4-butane tetracarboxylic dianhydride, decahydronaphthalene-1,4,5,8-tetracarboxylic dianhydride, 4,8-dimetthyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutane tetracarboxylic dianhydride, bis(exo-bicyclo [2,2,1] heptane-2,3-dicarboxylic dianhydride, bicycle[2,2,2]-octo-7-ene-2,3,5,6-tetracarboxylic dianhydride, 2,2-bis(3,4-dicarboxyphenyl) hexafluoropropane dianhydride, 2,2-bis [4-(3,4-dicarboxyphenyl) phenyl] hexafluoropropane dianhydride, 4,4'-bis(3,4-dicarboxyphenoxy) diphenylsulfide dianhydride, 1,4-bis(2-hydroxyhexafluoroisopropyl) benzene bis(trimellitate anhydride), 1,3-bis(2-hydroxyhexafluoroisopropyl) benzene bis(trimellitate anhydride), 5-(2,5-dioxotetrahydrofuryl)-3-methyl-3-cyclohexene-1,2-dicarboxylic dianhydride, tetrahydrofurane-2,3,4,5-tetracarboxylic dianhydride, and the like. One type of these compounds may be used alone, or more than one type of these compounds may be used in combination.

The diamine used as a raw material of the polyimide resin is not particularly limited. For example, the use can be made of:

aromatic diamines such as o-phenylene diamine, m-phenylene diamine, p-phenylene diamine, 3,3'-diaminodiphenylether, 3,4'-diaminodiphenylether, 4,4'-diaminodiphenylether, 3,3'-diaminodiphenyl methane, 3,4'-diaminodiphenyl methane, 4,4'-diaminodiphenyl, ether methane, bis(4-amino-3,5-dimethylphenyl) methane, bis(4-amino-3,5-diisopropylphenyl) methane, 3,3'-diaminodiphenyldifluoromethane, 3,4'-diaminodiphenyldifluoromethane, 4,4'-diaminodiphenyldifluoromethane, 3,3'-diaminodiphenyl sulfone, 3,4'-diaminodiphenyl sulfone, 4,4'-diaminodiphenyl sulfone, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 2,2-bis(3-aminophenyl) propane, 2,2'-(3,4'-diaminodiphenyl) propane, 2,2-bis(4-aminophenyl) propane, 2,2-bis(3-aminophenyl) hexafluoropropane, 2,2-(3,4'-diaminodiphenyl) hexafluoropropane, 2,2-bis(4-aminophenyl) hexafluoropropane, 1,3-bis(3-aminophenoxy) benzene, 1,4-bis(3-aminophenoxy) benzene, 1,4-bis(4-aminophenoxy) benzene, 3,3'-(1,4-phenylene bis(1-methylethylidene)) bisaniline, 3,4'-(1,4-phenylene bis(1-methylethylidene)) bisaniline, 4,4'-(1,4-phenylenebis(1-methylethylidene)) bisaniline, 2,2-bis(4-(3-aminophenoxy) phenyl) propane, 2,2-bis(4-(4-aminophenoxy) phenyl) propane, 2,2-bis(4-(3-aminophenoxy) phenyl) hexafluoropropane, 2,2-bis(4-(4-aminophenoxy) phenyl) hexafluoropropane, bis(4-(3-aminophenoxy) phenyl) sulfide, bis(4-(4-aminophenoxy) phenyl) sulfide, bis(4-(3-aminophenoxy) phenyl) sulfone, bis(4-(4-aminophenoxy) phenyl) sulfone, or 3,5-diamino benzoic acid;

aliphatic diamines such as 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diaminocyclohexane, diaminopolysiloxane represented by the following Formula (1), 1,3-bis(aminomethyl) cyclohexane, or polyoxyalkylene diamines such as JEFFAMINE D-230, D-400, D-2000, D-4000, ED-600, ED-900, ED-2001, or EDR-148, each of which is manufactured by Sun Technochemical Co., Ltd.; and the like. These may be used alone or in combination of 2 or more kinds. The glass transition temperature of the above-described polyimide resin is preferably from 0 to 200° C., and the mass average molecular weight thereof is preferably from 10,000 to 200,000.

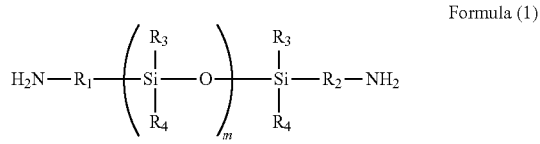

Formula (1)

In Formula (1), $R_1$ and $R_2$ represent a divalent hydrocarbon group having 1 to 30 carbon atoms and these groups may be the same or different from each other; $R_3$ and $R_4$ represent a monovalent hydrocarbon group and these groups may be the same or different from each other; m is an integer of 1 or more than 1.

As the phenoxy resin, those resins obtained by a method of reacting a various kinds of bisphenol and epichlorohydrin, or a method of reacting a liquid epoxy resin and a bisphenol are preferable. Examples of the bisphenol include bisphenol A, bisphenol bisphenol AF, bisphenol AD, bisphenol F, and bisphenol S. The phenoxy resin has a good compatibility with an epoxy resin, resulting from a structural similarity of the phenoxy resin to the epoxy resin, and therefore is suitable for giving a good adherence property to the adhesive.

Examples of the phenoxy resin for use in the present invention include a resin having a recurring unit represented by the following Formula (2).

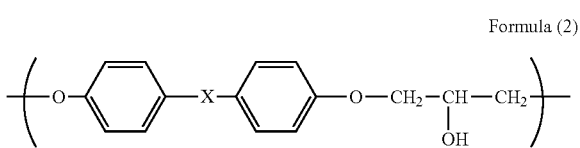

Formula (2)

In the above Formula (2), X represents a single bond or a divalent linking group. Examples of the divalent linking group include an alkylene group, a phenylene group, —O—, —S—, —SO—, and —SO$_2$—. Herein, the alkylene group is preferably an alkylene group having 1 to 10 carbon atoms and more preferably —C($R_5$)($R_6$)—. $R_5$ and $R_6$ represent a hydrogen atom or an alkyl group. As the alkyl group, a straight or branched alkyl group having 1 to 8 carbon atoms is preferable. Examples thereof include methyl, ethyl, n-propyl, isopropyl, isooctyl, 2-ethylhexyl, 1,3,3-trimethylbutyl, and the like. Further, said alkyl group may be substituted with a halogen atom. Examples thereof include a trifluoro methyl group. X is preferably an alkylene group, —O—, —S—, a fluorene group, or —SO$_2$—, and more preferably an alkylene group or —SO$_2$—. Especially, —C(CH$_3$)$_2$—, —CH(CH$_3$)—, —CH$_2$—, and —SO$_2$— are preferable. —C(CH$_3$)$_2$—, —CH(CH$_3$)—, and —CH$_2$— are more preferable. In particular, —C(CH$_3$)$_2$— is preferable.

The phenoxy resin having a recurring unit represented by the above-described Formula (2) may be a resin having more than one recurring unit in which, in Formula (2), multiple X's are different from each other, or may be a resin consisting only of recurring units in which multiple X's are the same. In the present invention, said resin consisting only of recurring units in which multiple X's are the same is preferable.

Further, by incorporating a polar substituent such as a hydroxy group, a carboxy group, or the like in the phenoxy resin represented by the above-described Formula (2), compatibility with a thermal polymerizable component is improved, whereby a homogeneous appearance and characteristics can be given.

It is preferable that a mass-average molecular weight of the phenoxy resin is 5000 or more, in terms of film-forming property. The mass-average molecular weight is more preferably 10,000 or more, and still more preferably 30,000 or more. On the other hand, it is preferable that a mass-average molecular weight is 150,000 or less, in terms of flowability in heat and pressure bonding to the wafer and compatibility with other resins. The mass-average molecular weight is more preferably 100,000 or less. Further, it is preferable that a glass transition temperature is −50° C. or more, in terms of film-forming property. The glass transition temperature is more preferably 0° C. or more, and still more preferably 50° C. or more. The glass transition temperature is preferably 150° C. or less, because the adhesive layer 13 at the time of die-bonding shows a high adhesion force. The glass transition temperature is more preferably 120° C. or less, and still more preferably 110° C. or less.

On the other hand, examples of the functional group of the polymer having the above-described functional group include a glycidyl group, an acryloyl group, a methacryloyl group, a hydroxy group, a carboxy group, an isocyanulate group, an amino group, an amide group, and the like. In particular, a glycidyl group is preferable.

Examples of the polymer having the above-described functional group include a (meth)acrylic copolymer having a functional group such as a glycidyl group, a hydroxy group, a carboxy group, and the like.

As the (meth)acrylic copolymer of the (meth)acrylic copolymer having the above-described functional group, for example, a (meth)acrylic ester copolymer, an acrylic rubber, and the like can be used, and an acrylic rubber is preferable. The acrylic rubber is a rubber consisting primarily of an acrylic ester and is preferably composed of a copolymer of butyl acrylate and acrylonitrile or the like, or a copolymer of ethyl acrylate and acrylonitrile or the like.

In a case of having a glycidyl group as the functional group of the (meth)acrylic copolymer having the above-described functional group, a proportion of the glycidyl group-containing recurring unit is preferably from 0.5 to 6.0% by mass, more preferably from 0.5 to 5.0% by mass, and particularly preferably from 0.8 to 5.0% by mass. The glycidyl group-containing recurring unit means a constituent monomer of the (meth)acrylic copolymer having a glycidyl group. Specifically, the constituent monomer is glycidyl acrylate or glycidyl methacrylate. If the proportion of the glycidyl group-containing recurring unit is within the above-described range, an adhesion force can be ensured and in conjunction with this, gelation can be prevented.

Examples of a constituent monomer of the (meth)acrylic copolymer having the above-described functional group, other than glycidyl acrylate or glycidyl methacrylate, include ethyl (meth)acrylate, butyl (meth)acrylate, and the like. These monomers may be used alone or in combination of 2 or more kinds. Meanwhile, in the present invention, the expression "ethyl (meth)acrylate" indicates ethyl acrylate and/or ethyl methacrylate.

In a case of using a constituent monomer of the (meth) acrylic copolymer having the above-described functional group (hereinafter, also referred to as a functional monomer) in combination with another constituent monomer, a mixing ratio of the functional monomer and the another constituent monomer may be well determined by considering a glass transition temperature of the (meth)acrylic copolymer having the functional group. To adjust the glass transition temperature to −50° C. or more is preferable in the points that a high film-forming property is achieved and an excess tack at an ordinary temperature can be suppressed. If the tack power at an ordinary temperature is excess, a handling of the adhesive layer becomes difficult. The glass transition temperature is more preferably −20° C. or more, and still more preferably 0° C. or more. Further, to adjust the glass transition temperature to 30° C. or less is preferable in terms of adhesion force of the adhesive layer at the time of die-bonding. More preferable glass transition temperature is 20° C. or less.

In a case of producing a polymer having a functional group by polymerizing the above-described functional monomer and the another constituent monomer, the polymerization method is not particularly limited, For example, a method such as pearl polymerization, solution polymerization, and the like may be used. In particular, pearl polymerization is preferable.

In the present invention, the mass-average molecular weight of the polymer having a functional group is preferably 100,000 or more, in terms of film-forming property. More preferable mass-average molecular weight is 200,000 or more. Further, to adjust the mass-average molecular weight to 2,000,000 or less is preferable in the point that a heat flowability of the adhesive layer in the die-bonding process is improved. If the heat flowability of the adhesive layer in the die-bonding process is improved, adhesion between the adhesive layer and an adherend becomes better and adhesive force can be improved. Further, the concavity and convexity of the adherend is embedded, which becomes easy to suppress a void. The mass-average molecular weight is more preferably 1,000,000 or less, and still more preferably 800,000 or less. If adjusted to 500,000 or less, a greater effect can be obtained.

Further, the thermal polymerizable component is not particularly limited, as long as it is polymerized by heat. Examples thereof include: a compound having a functional group such as a glycidyl group, an acryloyl group, a methacryloyl group, a hydroxy group, a carboxy group, an isocyanulate group, an amino group, an amide, group, and the like; and a trigger material. These compounds may be used alone or in combination of 2 or more kinds. Given consideration on heat resistance as the adhesive layer, a thermosetting resin which is cured by heat to exert an adhesion effect is preferably contained together with a hardener and/or a hardening accelerator as a trigger material. Examples of the thermosetting resin include an epoxy resin, an acrylic resin, a silicone resin, a thermosetting polyimide resin, a polyurethane resin, a melamine resin, and a urea resin. In particular, the use of an epoxy resin is most preferable in the point that an adhesive layer having good properties of heat resistance, workability, and reliability is obtained.

The above-described epoxy resin is not particularly limited, as long as it exerts an adhesion effect by curing. As the epoxy resin, a bifunctional epoxy resin such as a bisphenol A-type epoxy resin; a novolac-type epoxy resin such as a phenol novolac-type epoxy resin, or a cresol novolac-type epoxy resin; and the like may be used. Further, commonly known epoxy resins such as a multifunctional epoxy resin, glycidyl amine-type epoxy resin, a hetero ring-containing epoxy resin, or an alicyclic epoxy resin may be applied.

Examples of the above-described bisphenol A-type epoxy resin include: EPIKOTE-series, manufactured by Mitsubishi Chemical Corporation (EPIKOTE 807, EPIKOTE 815, EPIKOTE 825, EPIKOTE 827, EPIKOTE 828, EPIKOTE 834, EPIKOTE 1001, EPIKOTE 1004, EPIKOTE 1007, EPIKOTE 1009); DER-330, DER-301, and DER-361, manufactured by Dow Chemical Company; YD8125 and YDF8170, manufactured by Nippon Steel & Sumikin Chemical Co., Ltd.; and the like.

Examples of the above-described phenol novolac-type epoxy resin include: EPIKOTE 152 and EPIKOTE 154, manufactured by Mitsubishi Chemical Corporation; EPPN-201 manufactured by Nippon Kayaku Co., Ltd.; DEN-438 manufactured by Dow Chemical Company; and the like.

Examples of the above-described o-cresol novolac-type epoxy resin include: EOCN-102S, EOCN-103S, EOCN-104S, EOCN-1012, EOCN-1025, and EOCN-1027, manufactured by Nippon Kayaku Co., Ltd.; YDCN701, YDCN702, YDCN703, and YDCN704 manufactured by Nippon Steel & Sumikin Chemical Co., Ltd.; and the like.

Examples of the above-described multifunctional epoxy resin include: EPON1031S manufactured by Mitsubishi Chemical Corporation; ARALDITE 0163 manufactured by Ciba Specialty Co., Ltd.; DENACOL EX-611, EX-614, EX-614B, EX-622, EX-512, EX-521, EX-421, EX-411, and EX-321, manufactured by Nagase Chemtex Corporation; and the like.

Examples of the above-described glycidyl amine-type epoxy resin include: EPIKOTE 604 manufactured by Mitsubishi Chemical Corporation; YH-434 manufactured by Toto Kasei Co., Ltd.; TETRAD-X and TETRAD-C, manufactured by Mitsubishi Gas Chemical Company Inc.; ELM-120 manufactured by Sumitomo Chemical Industry Company Limited; and the like.

Examples of the above-described hetero ring-containing epoxy resin include: ARALDITE PT810 manufactured by Ciba Specialty Co., Ltd.; ERL4234, ERL4299, ERL4221, and ERL4206, manufactured by UCC; and the like.

These epoxy resins may be used alone or in combination of 2 or more kinds thereof.

In order to cure the above-described thermosetting resin, additives may be appropriately added. Examples of the forgoing additives include a hardening agent, a hardening accelerator, a catalyst, and the like. In a case of using a catalyst, a promoter may be used as needed.

In a case of using an epoxy resin as the above-described thermosetting resin, an epoxy resin hardening agent or a hardening accelerator is preferably used. A combination use of these materials is more preferable. Examples of the epoxy resin hardening agent include a phenol resin, dicyandiamide, a boron trifluoride complex, an organic hydrazide compound, amines, a polyamide resin, an imidazole compound, a urea or thiourea compound, a polymercaptan compound, a polysulfide resin having a mercapto group at the end thereof, and an acid anhydride. These materials may be used alone or in combination of 2 or more kinds thereof.

Among these materials, examples of the boron trifluoride complex include boron trifluoride-amine complexes with a variety of amine compounds (preferably a primary amine). Examples of the organic hydrazide compound include isophthalic acid dihydrazide.

Examples of the phenol resin include: a novolac-type phenol resin such as a phenol novolac resin, a phenol aralkyl resin, a cresol novolac resin, a tert-butylphenol novolac resin, or a nonylphenol novolac resin; a resol-type phenol resin; a polyoxystyrene such as polyparastyrene; and the like. In particular, a resin of a phenol-based compound having at least 2 phenolic hydroxy groups in the molecule is preferable.

Examples of the resin of a phenol-based compound having at least 2 phenolic hydroxy groups in the molecule include a phenol novolac resin, a cresol novolac resin, a tert-butylphenol novolac resin, a dicyclopentadiene cresol novolac resin, a dicyclopentadiene phenol novolac resin, a xylylene-modified phenol novolac resin, a naphthol novolac resin, a trisphenol novolac resin, a tetrakisphenol novolac resin, a bisphenol A novolac resin, a poly-p-vinyl phenol resin, a phenol aralkyl resin, and the like. Further, among these phenol resins, a phenol novolac resin and a phenol aralkyl resin are particularly preferable and allow improvement of connection reliability.

Examples of the amines include a linear aliphatic amine (diethylene triamine, tri ethylene tetramine, hexamethylene diamine, N,N-dimethyl propylamine, benzyl dimethylamine, 2-(dimethylamino) phenol, 2,4,6-tris (dimethylaminomethyl) phenol, m-xylenediamine, and the like), a cyclic aliphatic amine (N-aminoethyl piperazine, bis(3-methyl-4-aminocyclohexyl) methane, bis(4-aminocyclohexyl) methane, menthene diamine, isophorone diamine, 1,3-bis(aminomethyl) cyclohexane, and the like), a heterocyclic amine (piperazine, N,N-dimethyl piperazine, triethylene diamine, melamine, guanamine, and the like), and an aromatic amine (methaphenylene diamine, 4,4'-diamino diphenyl methane, diamino, 4,4'-diamino diphenyl sulfone, and the like).

In addition to the above, examples of the epoxy resin hardening agent include a polyamide resin (polyamide amine is preferable, for example, a condensate of a dimer acid and a polyamine), an imidazole compound (2-phenyl-4,5-dihydroxymethyl imidazole, 2-methyl imidazole, 2,4-dimethyl imidazole, 2-n-heptadecyl imidazole, 1-cyanoethyl-2-undecyl imidazolium·trimellitate, an epoxy·imidazole adduct, and the like), a urea or thiourea compound (N,N-dialkyl urea compound, N,N-dialkyl thiourea compound, and the like), a polymercaptan compound, a polysulfide resin having a mercapto group at the end thereof, and an acid anhydride (tetrahydrophtharic acid anhydride, and the like).

The hardening accelerator is not particularly limited, as long as it hardens a thermosetting resin. Examples thereof include imidazoles, dicyan diamide derivatives, dicarboxylic acid dihydrazide, triphenyl phosphine, tetraphenyl phosphonium tetraphenyl borate, 2-ethyl-4-methylimidazole-tetraphenyl borate, 1,8-diazabicyclo [5.4.0] undecene-7-tetrapheny borate, and the like.

Examples of the imidazoles include imidazole, 2-methyl imidazole, 2-ethyl imidazole, 2-ethyl-4-methyl imidazole, 2-phenyl imidazole, 2-phenyl-4-methyl imidazole, 1-benzyl-2-methyl imidazole, 1-benzyl-2-ethyl imidazole, 1-benzyl-2-ethyl-5-methyl imidazole, 2-phenyl-4-methyl-5-hydroxydimethyl imidazole, 2-phenyl-4,5-dihydroxymethyl imidazole, and the like.

The content of the epoxy resin hardening agent or the hardening accelerator in the adhesive layer is not particularly limited, and an optimal content thereof varies depending on the type of the hardening agent or the hardening accelerator.

The above-described epoxy resin and phenol resin are preferably blended in a bending ratio such that, for example, a hydroxy group in the phenol resin is within a range of 0.5 to 2.0 equivalents per equivalent of the epoxy group in the component of the above-described epoxy resin. More preferable bending ratio is from 0.8 to 1.2 equivalents. This is because if the bending ratio of these components is outside the above-described range, an adequate curing reaction is not achieved, so that characteristics of the adhesive layer become easily deteriorated.

As a blending ratio of another thermosetting resin and a hardening agent, the hardening agent is blended in a range of 0.5 to 20 parts by mass in one embodiment, and in a range of 1 to 10 parts by mass in another embodiment, with respect to 100 parts by mass of the thermosetting resin. It is preferable that the content of the hardening accelerator is less than that of the hardening agent. The content of the hardening accelerator is preferably from 0.001 to 1.5 parts by mass and more preferably from 0.01 to 0.95 parts by mass, with respect to 100 parts by mass of the thermosetting resin. Adjustment to the above-described range allows aid of progression of an adequate curing reaction. The content of the catalyst is preferably from 0.001 to 1.5 parts by mass, and more preferably from 0.01 to 1.0 part by mass, with respect to 100 parts by mass of the thermosetting resin.

Further, in the adhesive layer 13 in the present invention, a filler may be blended appropriately in accordance with its intended use. This allows, in an uncured state of the adhesive layer, improvement in a dicing property, improvement in handleability, adjustment of melt viscosity, application of thixotropic property; and further in the cured state of the adhesive layer, application of thermal conductivity, and improvement in adhesive power.

As the filler for use in the present invention, inorganic fillers are preferable. The inorganic filler is not particularly limited. For example, the use can be made of aluminum hydroxide, magnesium hydroxide, calcium carbonate, magnesium carbonate, calcium silicate, magnesium silicate, calcium oxide, magnesium oxide, alumina, aluminum nitride, aluminum borate whisker, boron nitride, crystalline silica, non-crystalline silica, antimony oxide, and the like. Further, these materials may be used as a single body or a mixture of 2 or more kinds thereof.

Further, among the above-described inorganic fillers, from the viewpoint of improvement in thermal conductivity, the use of alumina, aluminum nitride, boron nitride, crystalline silica, non-crystalline silica, and the like is preferable. Further, from the viewpoint of adjustment of melt viscosity or imparting of thixotropic property, the use of aluminum hydroxide, magnesium hydroxide, calcium carbonate, magnesium carbonate, calcium silicate, magnesium silicate, calcium oxide, magnesium oxide, alumina, crystalline silica, non-crystalline silica, and the like is preferable.

The content ratio of the filler is preferably 30% by mass or more in 100% by mass of the adhesive, in terms of wire bonding property. In the wire bonding, it is preferable that a storage elastic modulus after curing the adhesive layer adhering to semiconductor chips to be connected to a wire is adjusted to a range of 20 to 1000 MPa at 170° C. If the content ratio of the filler is 30% by mass or more, the storage elastic modulus after curing the adhesive layer is easily adjusted to this range.

Further, the content ratio of the filler is preferably 75% by mass or less, in terms of film formation property and thermal flowability of the adhesive layer in the die-bonding. If the thermal flowability of the adhesive layer in the die-bonding is improved, adhesion between the adhesive layer and the adherend becomes good, whereby an adhesive force can be improved. Further, the concavity and convexity of the adherend is embedded, whereby a void becomes easily suppressed. More preferable content ratio of the filler is 70% by mass or less, and still more preferable content ratio is 60% by mass or less.

The adhesive layer in the present invention may contain 2 or more types of fillers having a different average particle diameter from each other as the above-described filler. In this case, as compared to the case of using single filler, in a mixture of raw materials prior to film formation, viscosity increase in a case of high content ratio of the filler or viscosity decrease in a case of low content ratio of the filler becomes easily prevented, whereby a good film formation property becomes easily obtained. Further, the flowability of the uncured adhesive layer can be optimally controlled, and also after curing the adhesive layer, a desired adhesive force becomes easily obtained.

Further, in the adhesive layer for use in the present invention, the average particle diameter of the filler is preferably 2.0 μm or less and more preferably 1.0 μm. If the average particle diameter of the filler is 2.0 μm or less, such filler is suitable for film-thinning of the adhesive layer. Herein, the thin film indicates, for example, a thickness of 20 μm or less. Further, if the average particle diameter of the filler is 0.01 μm or more, a favorable dispersion property is achieved.

Further, 2 types of fillers are preferably used in combination from the viewpoints of preventing a viscosity increase or viscosity decrease of the adhesive composition prior to film formation, optimally controlling the flowability of the uncured adhesive layer, and/or improving an adhesive force after curing the adhesive layer. Specifically, the adhesive layer preferably contains a first filler in which an average particle diameter of the particles is within a range of 0.1 to 1.0 μm and a second filler in which an average particle diameter of the primary particles is within a range of 0.005 to 0.03 μm. It is more preferable that the adhesive layer contains a first filler in which an average particle diameter of the particles is within a range of 0.1 to 1.0 μm, and 99% or more of the particles have a distribution within a range of 0.1 to 1.0 μm and a second filler in which an average particle diameter of the primary particles is within a range of 0.005 to 0.03 μm and 99% or more of the particles have a distribution within a range of 0.005 to 0.1 μm.

The average particle diameter in the present invention means a D50 value of the cumulative volume distribution curve at which 50% by volume of the particles have a diameter less than said value. In the present invention, the average particle size or the D50 value is measured through laser diffractometry using, for example, a Malvern Mastersizer 2000 manufactured by Malvern Instruments. Ltd. In this technique, the size of particles in a disperse liquid is measured using diffraction of a laser beam, based on application of either Fraunhofer or Mie theory. In the present invention, Mie theory or a modified Mie theory for non-spherical particles is applied, and the average particle sizes or the D50 values relate to scattering measurements at an angle from 0.02 to 135° relative to the incident laser beam.

In the present invention, in one embodiment, in 100% by mass of the adhesive which constitutes the adhesive layer 13, from 10 to 40% by mass of a thermoplastic resin whose mass-average molecular weight is from 5,000 to 200,000, from 10 to 40% by mass of a heat polymerizable component, and from 30 to 75% by mass of a filler may be contained. In this embodiment, the content of the filler may be from 30 to 60% by mass, or may be from 40 to 60% by mass. Further, the mass-average molecular weight of the thermoplastic resin may be from 5,000 to 150,000, or may be from 10,000 to 100,000.

In another embodiment, in 100% by mass of the adhesive which constitutes the adhesive layer 13, from 10 to 20% by mass of a thermoplastic resin whose mass-average molecular weight is from 200,000 to 2,000,000, from 20 to 50% by mass of a heat polymerizable component, and from 30 to 70% by mass of a filler may be contained. In this embodiment, the content of the filler may be from 30 to 60% by mass, or may be from 30 to 50% by mass. Further, the mass-average molecular weight of the thermoplastic resin may be from 200,000 to 1,000,000, or may be from 200,000 to 800,000.

Adjustment of the blend ratio allows optimization of the storage elastic modulus and flowability after curing of the adhesive layer 13, and further an adequate heat resistance at a high temperature also tends to be obtained by the adjustment of the blend ratio.

The adhesive layer may be formed by using an ordinary method of forming an adhesive layer. For example, the adhesive layer may be formed by preparing an adhesive composition, and then coating and drying (for example, drying by heating) the adhesive composition.

The adhesive composition may be prepared, if need, by adding a commonly used solvent and the like to the above-described adhesive.

In the semiconductor-processing tape 10, the adhesive layer 13 may be formed by directly or indirectly laminating an adhesive preliminarily formed in the form of a film (hereinafter also referred to as an adhesive film) on a base material film 11. It is preferable that the laminate temperature is set to a range of 10 to 100° C. and also a linear pressure of 0.01 to 10 N/m is applied. Meanwhile, the adhesive film may be an element composed of an adhesive layer 13 formed on a release film. In this case, after laminating the adhesive film on a removable adhesive layer, the release film may be separated. Alternatively, using the release film without any change, as a cover film of the semiconductor-processing tape 10, said release film may be separated when a wafer is laminated on the semiconductor-processing tape.

Figure 3:
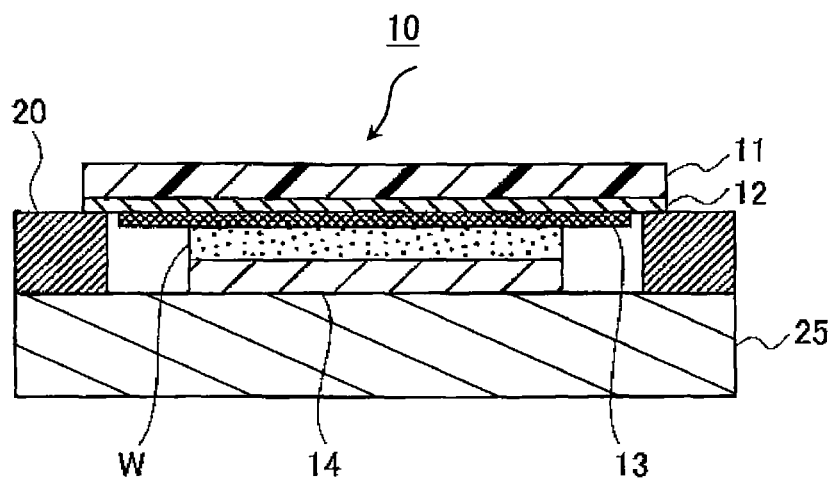
FIG. 3 is an end view for explaining a process of laminating a wafer and a ring flame on the semiconductor-processing tape according to an embodiment of the present invention.

The above-described adhesive film may be stacked all over a removable adhesive layer 12 in layers, or alternatively, an adhesive film which has been preliminarily cut (pre-cut) to a shape according to the wafer to be laminated may be stacked on the removable adhesive layer 12 in layers. In a case where an adhesive film according to a wafer is stacked in layers in this way, as shown in FIG. 3, the adhesive layer 13 is present at the portion on which a wafer W is to be laminated, while only the removable adhesive layer 12 without the adhesive layer 13 is present at the portion on which a ring frame 20 is to be laminated. In general, because the adhesive layer 13 is difficult to separate from an adherend, the ring frame 20 can be laminated on the removable adhesive layer 12 by using a pre-cut adhesive sheet. As a result, in separation of the tape after use, the use of the pre-cut adhesive sheet allows for a lessened adhesive deposit on the ring frame 20.

<Intended Use>

The semiconductor-processing tape 10 of the present invention is used at least in "the process (expansion process) of dividing an adhesive layer 13 along semiconductor chips by expansion (extension)", preferably in a method of producing semiconductor chips, which includes the expansion process. Accordingly, other processes, their order and the like are not particularly limited. For example, the semiconductor-processing tape can be used suitably for the following production methods (A) to (E) of the semiconductor chips.

The above-described expansion process corresponds, for example, to the process (f) of the following production methods (A) to (E).

Herein, the semiconductor chip (semiconductor element) means an element which is built so that an electric circuit is formed on a wafer of the semiconductor by wiring formation and the like. Examples thereof include semiconductor elements such as an integrated circuit, a transistor, a NAND-type or the like-type flash memory, DRAM, and the like.

Production Method (A) of Semiconductor Chips

A production method of semiconductor chips including the following processes (a) to (h):
- (a) A process of laminating a surface protective tape on the surface of a wafer formed with a circuit,
- (b) A back grind process of grinding a back surface of the above-described wafer,
- (c) A process of laminating an adhesive layer of the above-described semiconductor-processing tape, on the back surface of the above-described wafer at the heated state of said wafer,
- (d) A process of separating the surface protective tape from the wafer surface,
- (e) A process of irradiating a laser light to a planned dividing line of the wafer, to form a modified region due to multiphoton absorption, in the interior of the wafer,
- (f) An expansion process of expanding the above-described semiconductor-processing tape, thereby dividing the wafer and the adhesive layer along the planned dividing line, to obtain a plurality of semiconductor chips on each of which the adhesive layer has been laminated,
- (g) A process of maintaining a space between the above-described semiconductor chips, in the above-described semiconductor-processing tape after the expansion process, by subjecting a portion of said semiconductor-processing tape, which does not overlap with the above-described semiconductor chips, to heat shrinkage, and thereby to eliminate laxation caused by the expansion process, and
- (h) A process of picking up the above-described semiconductor chips on each of which the adhesive layer has been laminated, from a removable adhesive layer of the above-described semiconductor-processing tape, while maintaining the above-described space between the semiconductor chips.

Production Method (B) of Semiconductor Chips

A production method of semiconductor chips including the following processes (a) to (h):
- (a) A process of laminating a surface protective tape on the surface of a wafer formed with a circuit,
- (b) A back grind process of grinding a back surface of the above-described wafer,
- (c) A process of laminating an adhesive layer of the above-described semiconductor-processing tape, on the back surface of the above-described wafer at the heated state of said wafer,
- (d) A process of separating the surface protective tape from the wafer surface,
- (e) A process of irradiating a laser light along a planned dividing line of the above-described wafer surface, thereby dividing the above-described wafer into semiconductor chips,
- (f) An expansion process of expanding the above-described semiconductor-processing tape, thereby dividing the above-described adhesive layer with respect to each semiconductor chip, to obtain a plurality of semiconductor chips on each of which the above-described adhesive layer has been laminated,
- (g) A process of maintaining a space between the above-described semiconductor chips, in the above-described semiconductor-processing tape after the expansion process, by subjecting a portion of said semiconductor-processing tape, which does not overlap with the above-described semiconductor chips, to heat shrinkage, and thereby to eliminate laxation caused by the expanding process, and
- (h) A process of picking up the above-described semiconductor chips on each of which the above-described adhesive layer has been laminated, from a removable adhesive layer of the above-described semiconductor-processing tape.

Production Method (C) of Semiconductor Chips

A production method of semiconductor chips including the following processes (a) to (h):
- (a) A process of laminating a surface protective tape on the surface of a wafer formed with a circuit,
- (b) A back grind process of grinding a back surface of the above-described wafer,
- (c) A process of laminating an adhesive layer of the above-described semiconductor-processing tape on the back surface of the above-described wafer at the heated state of said wafer,
- (d) A process of separating the surface protective tape from the wafer surface,
- (e) A process of cutting the above-described wafer along a planned dividing line using a dicing blade, thereby dividing the wafer into semiconductor chips,
- (f) An expansion process of expanding the above-described semiconductor-processing tape, thereby dividing the above-described adhesive layer with respect to each semiconductor chip, to obtain a plurality of semiconductor chips on each of which the above-described adhesive layer has been laminated,
- (g) A process of maintaining a space between the above-described semiconductor chips in the above-described semiconductor-processing tape after the expansion process, by subjecting a portion of said semiconductor-processing tape, which does not overlap with the above-described semiconductor chips, to heat shrinkage, and thereby to eliminate laxation caused by the expanding process, and
- (h) A process of picking up the above-described semiconductor chips on each of which the above-described adhesive layer has been laminated, from a removable adhesive layer of the above-described semiconductor-processing tape.

Production Method (D) of Semiconductor Chips

A production method of semiconductor chips including the following processes (a) to (h):
- (a) A process of laminating a dicing tape on the back surface of a wafer formed with a circuit, and cutting the wafer up to a depth of less than the thickness of the wafer along a planned dividing line using a dicing blade,
- (b) A process of laminating a surface protective tape on the surface of the above-described wafer,
- (c) A back grind process of grinding the above-described wafer back surface after separating the above-described dicing tape from the wafer, and dividing the wafer into semiconductor chips,
- (d) A process of laminating, at the heated state of the above-described wafer, an adhesive layer of the above-described semiconductor-processing tape on the above-described back surface of the wafer divided into the above-described semiconductor chips,
- (e) A process of separating the surface protective tape from the above-described surface of the wafer divided into the above-described semiconductor chips,
- (f) An expansion process of expanding the above-described semiconductor-processing tape, thereby dividing the above-described adhesive layer for each semiconductor chip to obtain a plurality of semiconductor chips on each of which the above-described adhesive layer has been laminated, (g) A process of maintaining a space between the above-described semiconductor chips in the above-described semiconductor-processing tape after the expansion process, by subjecting a portion of said semiconductor-processing tape, which does not overlap with the above-described semiconductor chips, to heat shrinkage, and thereby to eliminate laxation caused by the expanding process, and (h) A process of picking up the above-described semiconductor chips on each of which the above-described adhesive layer has been laminated, from a removable adhesive layer of the above-described semiconductor-processing tape.

Production Method (E) of Semiconductor Chips

A production method of semiconductor chips including the following processes (a) to (h):

(a) A process of laminating a surface protective tape on the surface of a wafer formed with a circuit, (b) A process of irradiating a laser light to a planned dividing line of the above-described wafer, thereby forming a modified region due to multiphoton absorption in the interior of the above-described wafer, (c) A back grind process of grinding a back surface of the above-described wafer, (d) A process of laminating an adhesive layer of the above-described semiconductor-processing tape on the back surface of the above-described wafer at the heated state of said wafer, (e) A process of separating the surface protective tape from the wafer surface, (f) An expansion process of expanding the above-described semiconductor-processing tape, thereby dividing the wafer and the above-described adhesive layer of the above-described semiconductor-processing tape along a planned dividing line, to obtain a plurality of semiconductor chips on each of which the above-described adhesive layer has been laminated, (g) A process of maintaining a space between the above-described semiconductor chips in the above-described semiconductor-processing tape after the expansion process, by subjecting a portion of said semiconductor-processing tape, which does not overlap with the above-described semiconductor chips, to heat shrinkage, and thereby to eliminate laxation caused by the expanding process, and (h) A process of picking up the above-described semiconductor chips on each of which the above-described adhesive layer has been laminated, from a removable adhesive layer of the above-described semiconductor-processing tape.

In the production methods (A) to (E), prior to the pick-up process (for example, between the process (g) and the process (h) of the above-described production method (A)), it is preferable to contain a process (gh1) of expanding the semiconductor-processing tape. Pick-up becomes easy through the extension of expanding the space between semiconductor chips.

Further, in a case where the removable adhesive is energy ray-curable, it is preferable to contain a process (gh2) of irradiating energy ray to a removable adhesive layer, prior to the pick-up process (for example, between the process (g) and the process (h) of the above-described production method (A)). If the removable adhesive is modified to be a cured removable adhesive by curing according to the process (gh2), an adhesive power is lowered, so that the cured removable adhesive layer becomes easy to separate from the adhesive layer.

A heating temperature for the wafer in the process of laminating an adhesive layer of the above-described semiconductor-processing tape on the back surface of the wafer (for example, the process (c) of the production method (A)) is not particularly limited, as long as it is a temperature which softens an adhesive layer and allows lamination on the wafer. The forgoing temperature is preferably from 70 to 80° C.

<Usage>

Figure 2:
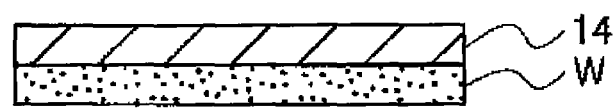
FIG. 2 is a cross-sectional view showing a state of the surface protective tape laminated on a wafer.

In a case where the semiconductor-processing tape 10 of the present invention was applied to the above-described production method (A) of semiconductor chip, usage of the tape is explained with reference to FIGS. 2 to 5. First, as shown in FIG. 2, after laminating a surface protective tape 14 for protecting a circuit pattern, in which an ultraviolet-curing component is contained in the removable adhesive layer, on the surface of the wafer W formed with a circuit, a back grinding process of grinding the back surface of the wafer W is conducted.

After ending of the back grinding process, as shown in FIG. 3, the wafer W is placed its surface-side down on a heater table 25 of the wafer mounter, and then the semiconductor-processing tape 10 is laminated on the back surface of the wafer W. The semiconductor-processing tape 10 used herein is a stacked product of the adhesive film preliminarily cut (pre-cut) in the shape according to the wafer W to be laminated. On the surface of the tape to be laminated on the wafer W, a removable adhesive layer 12 is exposed around the region where an adhesive layer 13 is exposed. This exposed portion of the adhesive layer 13 of the semiconductor-processing tape 10 is laminated on the back surface of the wafer W. In addition, the exposed portion of the removable adhesive layer 12 around the adhesive layer 13, is laminated on a ring frame 20. At this moment, the heater table 25 is set to a range of 70 to 80° C., whereby the wafer is heated to the range of 70 to 80° C. and a heat lamination is performed. The adhesive layer 13 is softened by this heat and is laminated on the wafer W. Meanwhile, in the above explanation, the use of the semiconductor-processing tape 10 having a removable adhesive tape 15 composed of a base material film 11 and a removable adhesive layer 12 provided on the base material film 11; and an adhesive layer 13 provided on the removable adhesive layer 12 was exemplified. However, a removable adhesive tape and a film-shaped adhesive may be used respectively. In this case, at the beginning, the film-shaped adhesive is laminated on the back surface of the wader to form an adhesive layer, and then a removable adhesive layer of the removable adhesive tape is laminated on the adhesive layer. At this moment, the removable adhesive tape 15 according to the present invention is used as a removable adhesive tape.

Figure 4:
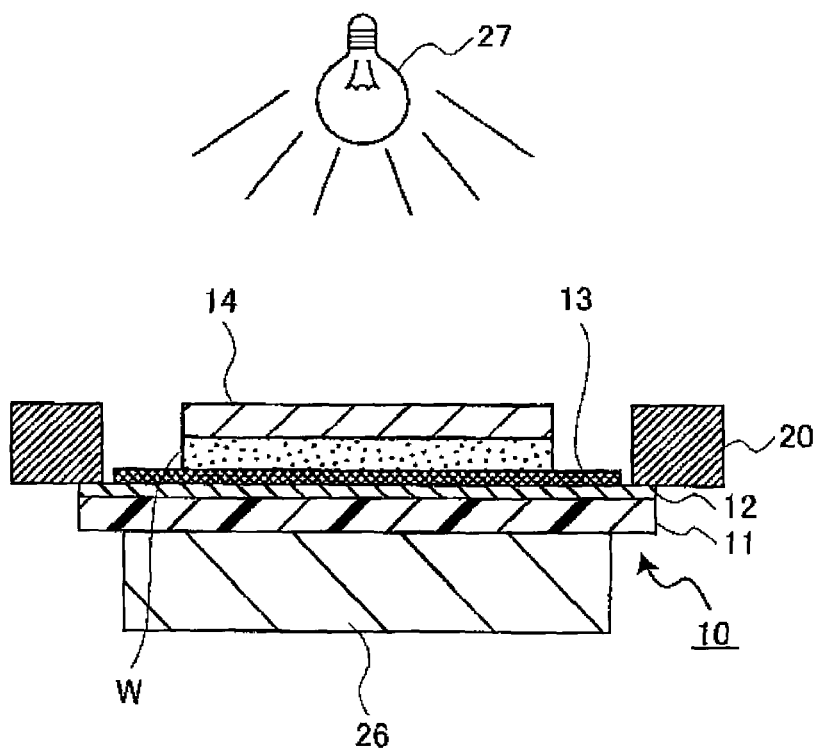
FIG. 4 is an end view for explaining a process of separating a surface protective tape from a surface of the wafer.

Next, the wafer W on which the semiconductor-processing tape 10 has been laminated is carried out from the heater table 25, and then, as shown in FIG. 4, is placed on an adsorption table 26 with the semiconductor-processing tape 10-side down. Further, above the wafer W adsorbed and fixed on the adsorption table 26, using an energy ray source 27, for example, a ultraviolet ray of 1000 mJ/cm² is irradiated to the base material film-side of the surface protective tape 14, whereby an adhesive power of the surface protective tape 14 to the wafer W is lowered so that the surface protective tape 14 is separated from the surface of the wafer W.

Figure 5:
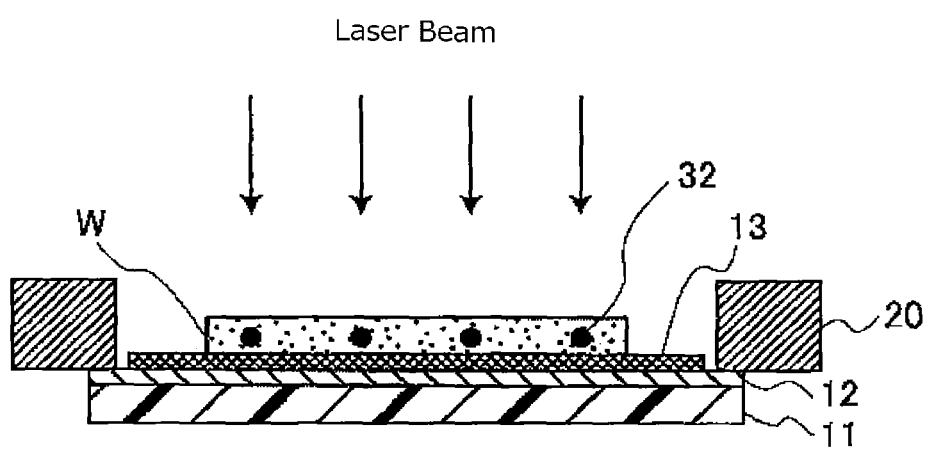
FIG. 5 is an end view for showing an appearance of a modified region formed in the wafer by a laser processing.

Next, as shown in FIG. 5, a laser light is irradiated to the estimated line (not shown) for division of the wafer W to form a modified region 32 due to multiphoton absorption in the interior of the wafer.

Figure 6A:
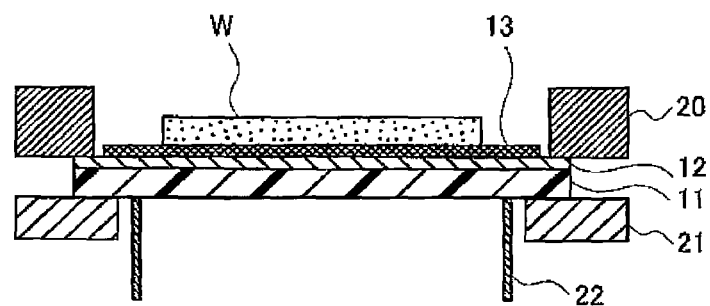
FIG. 6 ($a$) is a cross-sectional view showing a state of the semiconductor-processing tape according to an embodiment of the present invention, mounted in an expansion apparatus.
Figure 6B:
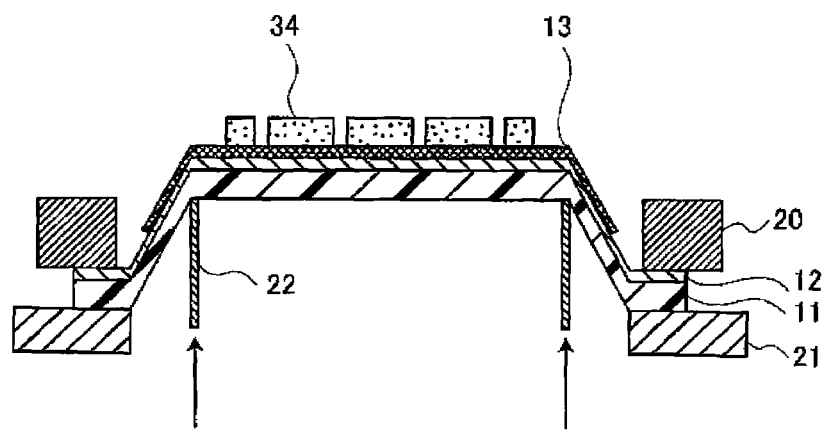
Figure 6C:
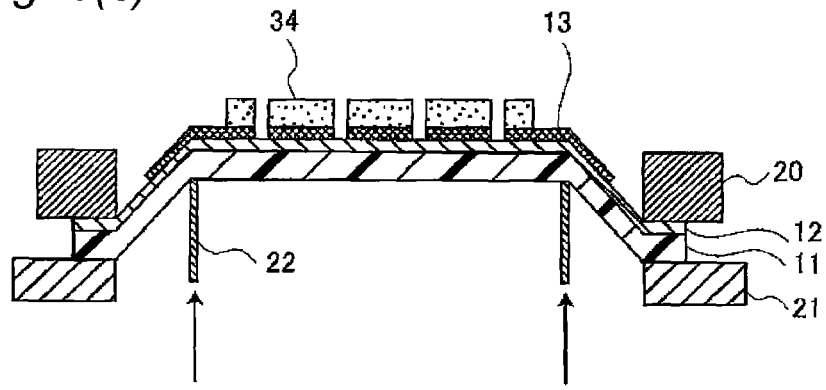

Next, as shown in FIG. 6 (a), the semiconductor-processing tape 10 on which the wafer W and the ring frame 20 have been laminated is placed on a stage 21 of the expanding apparatus, with the base material film 11-side down.

Next, as shown in FIG. 6 (b), while the ring frame 20 is in a state of being fixed, a push-up member 22 having a hollow cylindrical shape, in the expand apparatus, is uplifted, to extend (expand) the semiconductor-processing tape 10. As extending conditions, an expanding rate is, for example, from 5 to 500 mm/s and an expanding amount (push-up amount) is, for example, from 5 to 25 mm. In this way, by extension of the semiconductor-processing tape 10 in a radial direction of the wafer W, the wafer W is divided into units of semiconductor chip 34, originating from the above-described modified region as a starting point. In dividing the wafer W, at a portion of the adhesive layer adhering to the back surface of the wafer W, a stretch (deformation) due to extension is suppressed. On the other hand, at a position between semiconductor chips 34, a tension due to the stretch of the tape focuses. Accordingly, as shown in FIG. 6 (c), the adhesive layer 13 together with the wafer W is also divided at a position between semiconductor chips 34. In this way, a plurality of semiconductor chips 34 on which the adhesive layer 13 has been laminated can be obtained.

By reason that in a semiconductor-processing tape of the present invention, its base material film has a particular stress value and tensile strength, and a particular thickness, a stress due to expansion is adequately transmitted to an adhesive layer, so that the semiconductor-processing tape of the present invention allows division of the adhesive layer, even if the adhesive layer is thick and has a low storage elastic modulus.

Figure 7:
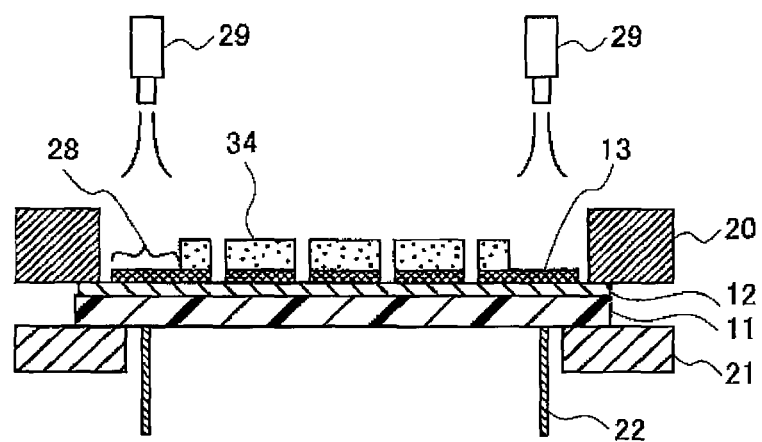
FIG. 7 is an end view for explaining a heat shrinkage process.

Next, as shown in FIG. 7, after putting the push-up member 22 back into place, a process of stably maintaining a space between the semiconductor chips 34 is performed, by eliminating laxation of the semiconductor-processing tape 10 caused by the previous expansion process. In this process, for example, by blowing down a hot air of 90 to 120° C. using a hot air nozzle 29 to an annulus heat-shrinkable region 28 located between a region of the semiconductor-processing tape 10 on which semiconductor chips 34 are present and a ring frame 20, the base material film 11 is subjected to a heat shrinkage, whereby the semiconductor-processing tape 10 is tightened.

By reason that in a semiconductor-processing tape of the present invention, its base material film has a specific stress value and tensile strength, and a specific thickness, a state of tension results in being maintained, whereby the semiconductor processing tape of the present invention allows equal retention of the space between semiconductor chips after heat shrinkage.

After that, an energy ray-curing processing or the like is applied to a removable adhesive layer 12 to weaken an adhesive power of the removable adhesive layer 12, and then semiconductor chips 34 are picked up.

Further, a die-bonding can be performed by laminating the adhesive layer of the picked-up semiconductor chip on an adherend such as a substrate, and then polymerizing a thermoplastic resin and a thermopolymerizable component in the adhesive layer at a range of 100 to 150° C., to modify said adhesive layer to a partially cured adhesive layer. After the die-bonding, a packaging can be conducted. At this moment, the adhesive layer is ultimately cured by heating at a range of 200 to 300° C.

Meanwhile, as mentioned above, it is also possible to conduct an energy-ray curing processing before the expansion processing.

EXAMPLES

The present invention will be described in more detail based on examples given below, but the invention is not meant to be limited by these.

[Preparation of Semiconductor-Processing Tape]

The semiconductor-processing tape of the structure shown in FIG. 1 was prepared in the following procedure.

(1) Preparation of Base Material Film

The following materials were used.

Ionomer resin A: Zinc ionomer resin of ethylene-methacrylic acid copolymer (trade name: Hi-milan 1706, manufactured by Dupont-Mitsui Polychemicals Co., Ltd., melting point: 88° C., MFR: 0.9 g/10 min (190° C., 2.16 kg))

Ionomer resin B: Zinc ionomer resin of ethylene-methacrylic acid copolymer (trade name: Hi-milan 1855, manufactured by Dupont-Mitsui Polychemicals Co., Ltd., melting point: 86° C., MFR: 1.0 g/10 min (190° C., 2.16 kg))

Ionomer resin C: Sodium ionomer resin of ethylene-methacrylic acid copolymer (trade name: Hi-milan 1707, manufactured by Dupont-Mitsui Polychemicals Co., Ltd., melting point: 89° C., MFR: 0.9 g/10 min (190° C., 2.16 kg))

Ionomer resin D: Zinc ionomer resin of ethylene-methacrylic acid copolymer (trade name: Hi-milan AM7326, manufactured by Dupont-Mitsui Polychemicals CO., Ltd., melting point: 101° C., MFR: 1.1 g/10 min (190° C., 2.16 kg))

Non-crosslinked resin A: A mixed resin with the mix of styrene-hydrogenated isoprene-styrene block copolymer (SEPS) (trade name: SEPTON KF2104, manufactured by Kuraray Co., Ltd., melting point: not determined, MFR: 0.4 g/10 min (230° C., 2.16 kg)) and homopolypropylene (PP) (trade name: J-105G, manufactured by Prime Polymers Inc., melting point: 160° C., MFR: 9.0 g/10 min (230° C., 2.16 kg)) in the proportion of SEPS:PP=35:65 (mass ratio)

Non-crosslinked resin B: A mixed resin with the mix of the above-described SEPS and the above-described PP in the proportion of SEPS:PP=45:55 (mass ratio)

Non-crosslinked resin C: A Mixed resin with the mix of the above-described SEPS and the above-described PP in the proportion of SEPS:PP=10:90 (mass ratio)

Thermoplastic crosslinked resin D: A resin of ethylene-methacrylic acid copolymer (trade name: Nucrel AN4214C, manufactured by Dupont-Mitsui-Polychemicals Co., Ltd., melting point: 92° C., MFR: 7.0 g/10 min (190° C., 2.16 kg))

<Base Material Film 1>

Using a three-layer extruder, resin beads of each of the ionomer resin A, the ionomer resin B, and the ionomer resin A were respectively melted at 150° C. and the melt resins were extruded so that a layer composed of the ionomer resin A, a layer composed of the ionomer resin B, and a layer composed of the ionomer resin A would be stacked up in this order, thereby obtaining a 80 μm-thick base material film 1. The layer constitution of the base material film 1 was culminated in the layer composed of the ionomer resin A: the layer composed of the ionomer resin B: the layer composed of the ionomer resin A=10 μm: 60 μm: 10 μm.

<Base Material Film 2>

Using a three-layer extruder, the non-crosslinked resin B, the non-crosslinked resin A, and the non-crosslinked resin C were molded into a film by extrusion molding at about 200° C. to obtain a 150 μm-thick base material film 2. The layer constitution of the base material film 2 was culminated in the layer composed of the non-crosslinked resin B: the layer composed of the non-crosslinked resin A: the layer composed of the non-crosslinked resin C=20 μm: 110 μm: 20 μm.

<Base Material Film 3>

Using a three-layer extruder, resin beads of each of the ionomer resin A, the ionomer resin B, and the ionomer resin. A were respectively melted at 150° C. and the melt resins were extruded so that a layer composed of the ionomer resin A, a layer composed of the ionomer resin B, and a layer composed of the ionomer resin A would be stacked up in this order, thereby obtaining a 100 μm-thick base material film 3. The layer constitution of the base material film 3 was culminated in the layer composed of the ionomer resin A: the layer composed of the ionomer resin B: the layer composed of the ionomer resin A=10 μm: 70 μm: 20 μm.

<Base Material Film 4>

Using a three-layer extruder, resin beads of each of the ionomer resin C, the ionomer resin 13, and the ionomer resin C were respectively melted at 150° C. and the melt resins were extruded so that a layer composed of the ionomer resin C, a layer composed of the ionomer resin B, and a layer composed of the ionomer resin C would be stacked up in this order, thereby obtaining a 150 μm-thick base material film 4. The layer constitution of the base material film 4 was culminated in the layer composed of the ionomer resin C: the layer composed of the ionomer resin B: the layer composed of the ionomer resin C=15 μm: 120 μm: 15 μm.

<Base Material Film 5>

Using a three-layer extruder, resin beads of each of the thermoplastic crosslinked resin D, the ionomer resin D, and the thermoplastic crosslinked resin D were respectively melted at 170° C. and the melt resins were extruded so that a layer composed of the thermoplastic crosslinked resin D, a layer composed of the ionomer resin D, and a layer composed of the thermoplastic crosslinked resin D would be stacked up in this order, thereby obtaining a 80 μm-thick base material film 5. The layer constitution of the base material film 5 was set to the layer composed of the thermoplastic crosslinked resin D: the layer composed of the ionomer resin D: the layer composed of the thermoplastic crosslinked resin D=8 μm: 64 μm: 8 μm.

<Base Material Film 6>

Resin beads of the ionomer resin B was melt at 140° C. and the melt resin was formed into a long film having a thickness of 50 μm using a single layer extruder, to obtain a base material film 6.

<Base Material Film 7>

Resin beads of the ionomer resin B was melt at 140° C. and the melt resin was formed into a long film having a thickness of 170 μm using a single layer extruder, to obtain a base material film 7.

(2) Preparation of Removable Adhesive Composition

A (meth)acrylic copolymer having a mass-average molecular weight of 750,000 and composed of a 2-ethylhexyl acrylate component, a 2-hydroxyethyl acrylate component, and a methacrylic acid component in the proportion of 78% by mole of the 2-ethylhexyl acrylate component, 21% by mole of the 2-hydroxyethylacrylate component and 1% by mole of the methacrylic acid component was prepared. Next, 2-isocyanatoethyl methacrylate was mixed with the obtained (meth)acrylic copolymer so that a double bond amount is 1.0 meq/g, to prepare a polymer (A) having a glass transition temperature of −64° C., a hydroxy value of 34 mgKOH/g, and an acid value of 6 mgKOH/g.

A mixture having a mixture fraction that 3 parts by mass of P301-75E (manufactured by Asahi kasei Chemicals Corporation) as a polyisocyanates of the Compound (B) and 3 parts by mass of Esacure KIP 150 (manufactured by Lamberti S.p.A.) as an energy-ray polymerization initiator (C) have been added with respect to 100 parts by mass of the polymer (A) was dissolved in ethyl acetate and was stirred, to prepare a removable adhesive composition.

(3) Preparation of Adhesive Composition

MEK was added to a mixture with the mix of 6.2 parts by mass of Epoxy resin "1002" (solid bisphenol A-type epoxy resin, manufactured by Mitsubishi Chemical Corporation, epoxy equivalent 600), 51.8 parts by mass of Phenol resin "MEH-7851SS" (trade name, manufactured by Meiwa Plastic Industries, Ltd., a biphenyl novolac phenol resin, hydroxy equivalent 201), 41.9 parts by mass of Epoxy resin "806" (trade name, bisphenol F-type epoxy resin, manufactured by Mitsubishi Chemical Corporation, epoxy equivalent 160, specific gravity 1.20), 81.5 parts by mass of Silica filler "SO-C2" (trade name, manufactured by Admatechs, average particle size 0.5 μm), and 2.9 parts by mass of Silica filler "AEROSIL" (trade name, manufactured by Nippon Aerosil CO., Ltd., average particle size of primary particles 0.016 μm) and they were mixed by stirring, to prepare a composition.

To the obtained composition, 23.0 parts by mass of a (meth)acrylic copolymer (mass-average molecular weight 260,000) containing 3% by mass of a monomer unit derived from glycidyl acrylate or glycidyl methacrylate as a polymer having a functional group, 0.6 parts by mass of "KBM-802" (trade name, manufactured by Shin-Etsu Silicones, mercaptopropyl trimethoxy silane) as a coupling agent, and 0.1 parts by mass of "curezol 2PHZ-PW" (trade name, manufactured by Shikoku Chemicals Corporation, 2-phenyl-4,5-dihydroxymethylimidazole, decomposition temperature 230° C.) as a curing accelerator were added and were mixed by stirring until the mixture becomes homogenized. Further, this mixture was filtrated with a 100-mesh filter and was subjected to a vacuum degassing, thereby obtaining an adhesive composition (b-1).

Example 1

To the release-treated surface of a release liner composed of a polyethylene-terephthalate film one surface of which has been subjected to a release treatment, the removable adhesive composition was coated so that a thickness after drying would be 10 μm. After drying it at 110° C. for 2 minutes, the coated composition was laminated on the base material film 1, to prepare a removable adhesive sheet having a removable adhesive layer formed on the base material film 1.

Next, to the release-treated surface of another release liner composed of a polyethylene-terephthalate film one surface of which has been subjected to a release treatment, the adhesive composition (b-1) was coated so that a thickness after drying would be 60 μm. Drying it at 130° C. for 3 minutes, an adhesive film having an adhesive layer formed on the release liner was prepared.

Next, the removable adhesive sheet was cut into a circle of the size enough to allow the circle to laminate on a ring frame so as to cover a portion of the opening of the ring frame. Further, the adhesive film was cut into a circle of the size enough to allow the circle to cover a back surface of the wafer. Then, the removable adhesive layer of the removable adhesive sheet and the adhesive layer of the adhesive film were concentrically laminated, to prepare a semiconductor-processing tape 1 having a portion of the removable adhesive layer exposed around the adhesive layer.

Example 2

The semiconductor-processing tape 2 was prepared by the same materials and manner as in Example 1, except for using the base material film 2 as a base material film. A layer composed of the non-crosslinked resin B of the base material film 2 was laminated on the dried removable adhesive composition.

Example 3

The semiconductor-processing tape 3 was prepared by the same materials and manner as in Example 1, except for using the base material film 3 as a base material film. The 10 μm-thick layer side of the two layers composed of the ionomer resin A of the base material film 3 was laminated on the removable adhesive layer.

Example 4

The semiconductor-processing tape 4 was prepared by the same materials and manner as in Example 1, except for using the base material film 4 as a base material film.

Comparative Example 1

The semiconductor-processing tape 5 was prepared by the same materials and manner as in Example 1, except for using the base material film 5 as a base material film.

Comparative Example 2

The semiconductor-processing tape 6 was prepared by the same materials and manner as in Example 1, except for using the base material film 6 as a base material film.

Comparative Example 3

The semiconductor-processing tape 7 was prepared by the same materials and manner as in Example 1, except for using the base material film 7 as a base material film.

(Stress Value at the Time of 5% Elongation)

The stress values at the time of 5% elongation in both MD direction and TD direction of the semiconductor-processing tapes 1 to 7 were measured as follows: Using the base material films 1 to 7 in conformity with test pieces described in JIS K7127:1999 and a test rate JIS K7127/2/300, the test pieces whose lengths each respectively meet the MD direction and the TD direction were cut out of each of the base Material films, and a tensile test was conducted. The stress values at the time when the displacement in the MD direction is 5% was designated as a stress at the time of 5% elongation in MD, while the stress values at the time when the displacement in the TD direction is 5% was designated as a stress at the time of 5% elongation in TD.

(Tensile Strength at the Time of 5% Elongation)

The tensile strength values at the time of 5% elongation of both in MD and TD of the base material films 1 to 7 were measured in the same manner as the above-described stress values at the time of 5% elongation, in conformity with JIS K7127/2/300.

(Storage Elastic Modulus)

The storage elastic modulus at 25° C. of the adhesive layer was measured as follows.

An adhesive composition was coated on a release film so that the thickness after drying would be 20 μm, thereby forming an adhesive layer. In the same manner, multiple release films each provided with an adhesive layer were prepared and then, after separating each of the adhesive layers from the release films, the separated adhesive layers were laminated on top of each other so that a total thickness would be about 2 mm, thereby preparing a test sample. The test sample was stamped into a 8 mm-diameter disc-like member and was tucked with parallel plate, and the storage elastic modulus was measured under the following conditions using an elastic modulus analyzer (trade name: ARES manufactured by TI Instruments Ltd.).

Measuring temperature: 25° C.
Measuring frequency: 6.3 rad/s

Further, the storage elastic modulus at 70° C. of the adhesive layer was measured in the same manner as the above, except for changing the measuring temperature to 70° C.

Test Example 1

Evaluation of Division Property

According to the method described below, the division property in the following processes of the semiconductor processing was evaluated with respect to each of the semiconductor-processing tapes of the above-described Examples and the above-described Comparative Examples.

(a) A surface protective tape was laminated on a surface of a wafer formed with a circuit-pattern (12-inch wafer).

(b) A back grind process of grinding a back surface of the wafer was conducted. The thickness of the wafer after grind was 50 μm.

(c) The release liner was separated from the above-described semiconductor-processing tape at the heated state of the wafer at 70° C. An adhesive layer of the above-described semiconductor-processing tape was laminated on the back surface of the wafer, and a ring frame for wafer processing was laminated on an exposed portion of a removable adhesive layer of the above-described semiconductor-processing tape which portion does not overlap with the adhesive layer (see FIG. 3).

(d) The surface protective tape was separated from the above-described wafer surface.

(e) By irradiating a laser light to a planned dividing line of the above-described wafer, a modified region due to multiphoton absorption was formed in the interior of said wafer (see FIG. 5).

(f) By 10%-expansion of the above-described semiconductor-processing tape in the outer peripheral direction of the above-described wafer, said wafer and the above-described adhesive layer were divided along the planned dividing line, to obtain a plurality of semiconductor chips on each of which said adhesive layer has been laminated. The bottom shape of the semiconductor chip was cut to size 5 mm×5 mm (see FIG. 6).

(g) By heating at 120° C. to shrink a portion of the above-described semiconductor-processing tape, which does not overlap with the semiconductor chips (an annulus region between a region at which said semiconductor chips are present and the ring frame), laxation caused by the expansion process (f) was eliminated, so that a space between said semiconductor chips was maintained (see FIG. 7).

Meanwhile, in the process (f), the expansion was conducted by pushing down the dicing ring frame laminated on the semiconductor-processing tape with expand rings of DDS-2300 manufactured by DISCO Corporation, and by pressing an outer peripheral portion of the wafer-laminated semiconductor-processing tape, which does not overlap with said wafer, against a circular push-up member. Further, the conditions of the process (f) were set to an expansion rate of 300 mm/sec. and an expansion amount (push-up amount) of 20 mm. Herein, the expansion amount means a variation of the relative position of the ring frame and the push-up member between before push-down and after push-down.

After the above-described processes (a) to (g), the semiconductor-processing tapes were examined to check if the adhesive layer has been divided.
—Evaluation Criteria—
  ○: A whole adhesive layer was divided along the planned dividing line (the same shape as the bottom shape)
  x: A partial or whole adhesive layer was not divided along the planned dividing line.

Test Example 2

Evaluation of Average Value and Uniformity of the Semiconductor Chip Space

Evaluation of the average value and the uniformity of the semiconductor chip space were conducted according to the following method and criteria.

After the above-described processes (a) to (g), among the obtained effective semiconductor chips (chips of objective size), each one of the semiconductor chips located in 5 parts of the top, the bottom, the center, the most left part and the most right part (5 parts of 12 o'clock direction (the top), 6 o'clock direction (the bottom), 3 o'clock direction (the most right part), 9 o'clock direction (the most left part) and the center, with respect to a center of the wafer placed notch-side down) was selected. A space between the selected semiconductor chip and the effective semiconductor chip lying adjacent to said selected semiconductor chip in the MD direction was measured at one point of the center of the side of these semiconductor chips lying adjacent to each other. This space was designated as a semiconductor chip space in MD. Further, a space between the selected semiconductor chip and the effective semiconductor chip lying adjacent to said selected semiconductor chip in the TD direction was measured at one point of the center of the side of these semiconductor chips lying adjacent to each other. This space was designated as a semiconductor chip space in TD.

From measurement values of the semiconductor chip space in MD and the semiconductor chip space in TD each measured at the above-described 5 parts, a minimum measurement value and an average value were calculated. Further, a uniformity value of the semiconductor chip space was calculated from the following equation. Further, an average value of the semiconductor chip space and a uniformity value of the semiconductor chip space were evaluated according to the following evaluation criteria.

Uniformity value of the semiconductor chip space=(Minimum measurement value of the 5 parts−Average value)/Average value
—Evaluation Criteria—
  ○: The average value of the semiconductor chip space is 20 μm or more and the uniformity value of the semiconductor chip space is from 0 to −0.5.
  x: The average value of the semiconductor chip space is 20 μm or more and the uniformity value of the semiconductor chip space is less than −0.5, or the average value of the semiconductor chip space is less than 20 μm.

Test Example 3

Evaluation of Pick-Up Property

After the above-described processes (a) to (g), evaluation of the pick-up property was conducted in the following processes.
  (gh1) Division of the chips was carried out by 10%-expansion of the semiconductor-processing tape.
  (h) The above-described semiconductor chips to which the adhesive layer had been adhered were picked up from the removable adhesive layer of the semiconductor-processing tape at the state of keeping the above-described semiconductor chip space.

Specifically, a pick-up test was conducted with respective to 100 of arbitrarily selected semiconductor chips using a die picker (trade name: CAP-300II, manufactured by Canon Machinery Inc.), and a pick-up success rate was calculated, considering that the case where an adhesive layer separated from the removable adhesive layer has been held on the semiconductor chip (an adhesive layer has been held over the entire adherend surface of the semiconductor chip) is a successful pick-up, whereby a pick-up property was evaluated.

Specific test conditions were set to the followings: a push-up height of the pin was 200 μm, the number of the pin was 5 (1 pin at the center and 4 pins at intervals of 7.5 mm at the circumference), the collet size was 7.5 mm×7.5 mm, a nose shape of the pin was 350 μmR, and a push-up rate was 10 mm/s.
—Evaluation Criteria—
  ○: A pick-up success rate is from 95 to 100%
  x: A pick-up success rate is less than 95%

Evaluation of the division property, the uniformity of the semiconductor chip space and the pick-up property in Examples 1 to 4 and Comparative Examples 1 to 3 are shown in Table 1.

TABLE 1

| | | Example 1 | Example 2 | Example 3 | Example 4 | Comparative example 1 | Comparative example 2 | Comparative example 3 |
|---|---|---|---|---|---|---|---|---|
| Base material film | Thickness [μm] | 80 | 150 | 100 | 150 | 80 | 50 | 170 |
| | Stress values at the time of 5% elongation in MD [MPa] | 6.1 | 5.71 | 8.16 | 7.01 | 4.2 | 6.1 | 7 |
| | Stress values at the time of 5% elongation in TD [MPa] | 6.8 | 5.47 | 8 | 7.04 | 4 | 7 | 11 |

TABLE 1-continued

|  |  | Example 1 | Example 2 | Example 3 | Example 4 | Comparative example 1 | Comparative example 2 | Comparative example 3 |
|---|---|---|---|---|---|---|---|---|
|  | Tensile strength at the time of 5% elongation in MD [N/25 mm] | 12.3 | 23.8 | 20.4 | 26.3 | 8.15 | 7.6 | 31.4 |
|  | Tensile strength at the time of 5% elongation in TD [N/25 Mm] | 13.6 | 22.8 | 20 | 26.4 | 8.2 | 8.5 | 31.5 |
| Adhesive layer | Storage elastic modulus at 25° C. [MPa] | 4.12 | 4.12 | 4.12 | 4.12 | 4.12 | 4:12 | 4.12 |
|  | Storage elastic modulus at 70° C. [Pa] | 45000 | 45000 | 45000 | 45000 | 45000 | 45000 | 45000 |
| Division property of adhesive layer |  | ○ | ○ | ○ | ○ | x | x | ○ |
| Average value and uniformity of semiconductor chip space |  | ○ | ○ | ○ | ○ | ○ | x | x |
| Pick-up property |  | ○ | ○ | ○ | ○ | ○ | x | x |

<Evaluation Results>

In Comparative Example 1, the division property of the adhesive layer was inferior because the stress value and the tensile strength at the time of 5%-elongation in the MD and the TD of the base material film were too low level.

In Comparative Example 2, any of the division properly of the adhesive layer, the average value and the uniformity of the semiconductor chip space, and the pick-up property were inferior because the tensile strength at the time of 5%-elongation in the MD and the TD of the base material film was too low level and the thickness of the base material film was too thin.

In Comparative Example 3, the average value and the uniformity of the semiconductor chip space and the pick-up property were inferior because the tensile strength at the time of 5%-elongation in the MD and the TD of the base material film was excessively high, and the thickness of the base material film was too thick.

The semiconductor-processing tapes of Examples 1 to 4 each having a base material film having predetermined stress value and tensile strength at the time of 5%-elongation in the MD and the TD and also a predetermined thickness excelled in any of the above-described Test Examples, even though the semiconductor-processing tape is provided with an adhesive layer having a thickness of 40 μm or more and a low storage elastic modulus of 2000 MPa or less. Specifically, the above-described semiconductor-processing tapes allowed division of the above-described adhesive layer, and the semiconductor chip space had a space enough for a die picker to recognize a semiconductor chip, and also extended uniformly in the MD and the TD, and further a good pick-up property was achieved.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2016-238020 filed in Japan on Dec. 7, 2016, which is entirely herein incorporated by reference.

REFERENCE SIGNS LIST

10: Semiconductor-processing tape
11: Base material film
12: Removable adhesive layer
13: Adhesive layer
14: Surface protective tape
20: Ring frame
21: Stage
22: Push-up member
25: Heater table
26: Adsorption table
27: Energy ray source
28: Heat-shrinkable region
29: Hot air nozzle
32: Modified region
34: Semiconductor chip
W: Wafer

The invention claimed is:

1. A semiconductor-processing tape, comprising:
a base material film, a removable adhesive layer, and an adhesive layer, in this order,
wherein the base material film has the characteristics that stress values in a machine direction (MD) and a transverse direction (TD) at a time of 5%-elongation are each 5 MPa or more, tensile strength values in MD and TD at the time of 5%-elongation are each from 10 to 30 N/25 mm, and a thickness is from 70 to 150 μm,
wherein the adhesive layer has the characteristics that a thickness is 60 to 200 μm and a storage elastic modulus at 25° C. is 2000 MPa or less, and
wherein the base material film has a multi-layer structure comprising two or more layers, and wherein each of the two or more layers of the multi-layer structure consists of an ionomer resin only.

2. A method of producing semiconductor chips, comprising:
(a) a step of laminating a surface protective tape on a surface of a wafer formed with a circuit-pattern,
(b) a back grind step of grinding a back surface of the wafer,
(c) a step of laminating the adhesive layer of the semiconductor-processing tape according to claim 1 on the back surface of the wafer when the wafer is being heated,
(d) a step of separating the surface protective tape from the surface of the wafer formed with the circuit-pattern,
(e) a step of irradiating a laser light to a dividing line of the wafer, to form a region modified by multiphoton absorption inside the wafer,
(f) an expansion step of expanding the semiconductor-processing tape, thereby dividing the wafer and the adhesive layer along the dividing line, to obtain a plurality of semiconductor chips on each of which the adhesive layer has been laminated, (g) a step of maintaining a space between the semiconductor chips in the semiconductor-processing tape after the expansion step, by subjecting a portion of said semiconductor-processing tape which does not overlap with the semiconductor chips, to heat shrinkage, and thereby to eliminate laxation caused by the expansion step, and (h) a step of picking up the semiconductor chips on each of which the adhesive layer has been laminated, from the removable adhesive layer of the semiconductor-processing tape, while maintaining the space between the semiconductor chips.

3. The semiconductor-processing tape described in claim 1, wherein the ionomer resin has a melting point of from 80 to 95° C. and a melt flow rate of from 0.5 to 5.0 g/10 min.

4. The semiconductor-processing tape described in claim 3, wherein the ionomer resin is a zinc ionomer resin, and a flexural modulus of the base material film is 200 MPa or less.

* * * * *